(12) United States Patent
Lin et al.

(10) Patent No.: US 10,908,494 B2
(45) Date of Patent: Feb. 2, 2021

(54) PHOTOMASK AND MANUFACTURING METHOD THEREOF

(71) Applicant: Taiwan Semiconductor Manufacturing Co., Ltd., Hsinchu (TW)

(72) Inventors: Cheng-Ming Lin, Yunlin County (TW); Cheng-Hsuen Chiang, Miaoli (TW); Chih-Ming Chen, Taoyuan County (TW); Huai-Chih Cheng, Pingtung County (TW); Hao-Ming Chang, Pingtung (TW); Hsao Shih, New Taipei (TW); Hsin-Yi Yin, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 135 days.

(21) Appl. No.: 15/687,541

(22) Filed: Aug. 27, 2017

(65) Prior Publication Data

US 2018/0348625 A1 Dec. 6, 2018

Related U.S. Application Data

(60) Provisional application No. 62/512,738, filed on May 31, 2017.

(51) Int. Cl.
*G03F 1/26* (2012.01)
*G03F 1/68* (2012.01)
(Continued)

(52) U.S. Cl.
CPC .............. *G03F 1/26* (2013.01); *G03F 1/68* (2013.01); *G03F 1/76* (2013.01); *G03F 1/82* (2013.01); *G03F 7/70458* (2013.01)

(58) Field of Classification Search
CPC .......... G03F 1/76; G03F 1/70458; G03F 1/68; G03F 1/82; G03F 1/26
See application file for complete search history.

(56) References Cited

U.S. PATENT DOCUMENTS

| | | | | |
|---|---|---|---|---|
| 4,734,746 A | * | 3/1988 | Ushida | G03F 7/2022 355/53 |
| 5,214,492 A | * | 5/1993 | Lobianco | G01B 11/26 356/400 |

(Continued)

FOREIGN PATENT DOCUMENTS

| | | | | |
|---|---|---|---|---|
| JP | 01-093127 | * | 4/1989 | ........... H01L 21/306 |
| JP | 03-180017 | * | 8/1991 | ............... G03F 9/00 |

(Continued)

*Primary Examiner* — Martin J Angebranndt
(74) *Attorney, Agent, or Firm* — JCIPRNET

(57) ABSTRACT

A method of manufacturing a photomask includes at least the following steps. First, a phase shift layer and a hard mask layer are formed on a light transmitting substrate. A predetermined mask pattern is split into a first pattern and a second pattern. A series of processes is performed so that the hard mask layer and the phase shift layer have the first pattern and the second pattern. The series of processes includes at least the following steps. First, a first exposure process for transferring the first pattern is performed. Thereafter, a second exposure process for transferring the second pattern is performed. The first exposure process and the second exposure process are executed by different machines.

20 Claims, 26 Drawing Sheets

(51) Int. Cl.
*G03F 1/76* (2012.01)
*G03F 1/82* (2012.01)
*G03F 7/20* (2006.01)

(56) References Cited

U.S. PATENT DOCUMENTS

| | | | | |
|---|---|---|---|---|
| 5,976,738 | A * | 11/1999 | Nakashima | G03F 7/2022 430/22 |
| 5,989,761 | A * | 11/1999 | Kawakubo | G03F 7/70358 430/22 |
| 6,007,324 | A * | 12/1999 | Tzu | G03F 7/203 430/394 |
| 6,599,666 | B2 * | 7/2003 | Rolfson | G03F 1/32 430/5 |
| 6,677,088 | B2 * | 1/2004 | Magome | G03F 1/78 430/22 |
| 7,108,946 | B1 * | 9/2006 | Lukanc | G03F 7/70633 430/22 |
| 8,716,841 | B1 | 5/2014 | Chang et al. | |
| 8,736,084 | B2 | 5/2014 | Cheng et al. | |
| 8,762,900 | B2 | 6/2014 | Shin et al. | |
| 8,796,666 | B1 | 8/2014 | Huang et al. | |
| 8,812,999 | B2 | 8/2014 | Liu et al. | |
| 8,837,810 | B2 | 9/2014 | Chen et al. | |
| 8,850,366 | B2 | 9/2014 | Liu et al. | |
| 8,906,595 | B2 | 12/2014 | Liu et al. | |
| 8,954,899 | B2 | 2/2015 | Wu et al. | |
| 9,093,530 | B2 | 7/2015 | Huang et al. | |
| 9,134,633 | B2 | 9/2015 | Lin et al. | |
| 9,230,867 | B2 | 1/2016 | Cheng et al. | |
| 9,304,403 | B2 | 4/2016 | Lin et al. | |
| 9,367,655 | B2 | 6/2016 | Shih et al. | |
| 9,390,217 | B2 | 7/2016 | Wang et al. | |
| 9,404,743 | B2 | 8/2016 | Chiu et al. | |
| 9,548,303 | B2 | 1/2017 | Lee et al. | |
| 2001/0009745 | A1 * | 7/2001 | Kim | G03F 1/32 430/5 |
| 2002/0051943 | A1 * | 5/2002 | Tanaka | G03F 1/32 430/311 |
| 2003/0036293 | A1 * | 2/2003 | Tanaka | G03F 1/32 438/780 |
| 2003/0219654 | A1 * | 11/2003 | Ushida | G03F 1/32 430/5 |
| 2004/0048166 | A1 * | 3/2004 | Chang | G03F 1/32 430/5 |
| 2005/0170261 | A1 * | 8/2005 | Watts | G03F 1/32 430/5 |
| 2005/0255389 | A1 * | 11/2005 | Tange | G03F 1/29 430/5 |
| 2007/0015089 | A1 * | 1/2007 | Peters | G03F 1/32 430/313 |
| 2007/0065731 | A1 * | 3/2007 | Ishiwata | G03F 1/32 430/5 |
| 2007/0238032 | A1 * | 10/2007 | Murano | G03F 1/32 430/5 |
| 2007/0243491 | A1 * | 10/2007 | Wu | G03F 1/32 430/311 |
| 2008/0241707 | A1 * | 10/2008 | Chen | G03F 1/32 430/5 |
| 2008/0280214 | A1 * | 11/2008 | Ryu | G03F 1/72 430/5 |
| 2009/0190118 | A1 * | 7/2009 | Fukuhara | G03B 27/32 355/77 |
| 2015/0331309 | A1 * | 11/2015 | Hsueh | G03F 1/28 430/5 |

FOREIGN PATENT DOCUMENTS

| | | | | |
|---|---|---|---|---|
| JP | 06-118619 | * | 4/1994 | G03F 1/08 |
| JP | 08-186073 | * | 7/1996 | G03F 1/08 |
| JP | 2000-012433 | * | 1/2000 | G03F 1/16 |
| JP | 2000-303193 | * | 10/2000 | G02B 5/18 |
| JP | 2001-281433 | * | 10/2001 | G03H 1/04 |
| JP | 2001-290014 | * | 10/2001 | G03F 7/26 |
| JP | 2003-121989 | * | 4/2003 | G03F 1/08 |
| JP | 2005-017488 | * | 1/2005 | G03F 1/08 |
| JP | 2006-195126 | * | 7/2006 | G03F 1/08 |
| JP | 2007-178807 | * | 7/2007 | G03F 1/08 |
| JP | 2009-237289 | * | 10/2009 | G03F 1/08 |
| JP | 2013-077665 | * | 4/2013 | G03F 7/20 |
| KR | 2011077968 | * | 7/2011 | G03F 1/08 |

* cited by examiner

PHOTOMASK AND MANUFACTURING METHOD THEREOF

CROSS-REFERENCE TO RELATED APPLICATION

This application claims the priority benefit of U.S. provisional application Ser. No. 62/512,738, filed on May 31, 2017. The entirety of the above-mentioned patent application is hereby incorporated by reference herein and made a part of this specification.

BACKGROUND

Photolithography is utilized in the fabrication of semiconductor devices to transfer a pattern onto a wafer. Based on various integrated circuit (IC) layouts, patterns are transferred from a photomask (or a reticles) to a surface of the wafer. As dimensions decrease and density in IC chips increases, resolution enhancement techniques, such as optical proximity correction (OPC), off-axis illumination (OAI), double dipole lithography (DDL) and phase-shift mask (PSM), are developed to improve depth of focus (DOF) and therefore to achieve a better pattern transfer onto the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
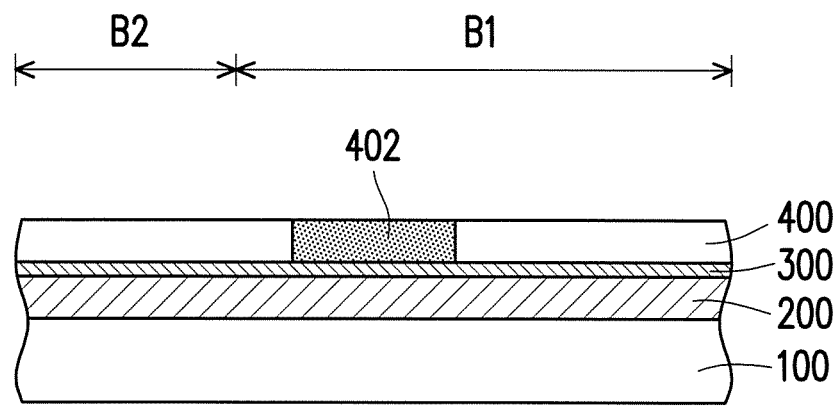
FIGS. 1A-1L are schematic cross-sectional views illustrating a process flow for manufacturing a photomask in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIGS. 1A-1L are schematic cross-sectional views illustrating a process flow for manufacturing a photomask 10A in accordance with some embodiments of the disclosure. Referring to FIG. 1A, a light transmitting substrate 100 is provided. A phase shift layer 200 and a hard mask layer 300 are sequentially formed on the light transmitting substrate 100. In other words, the phase shift layer 200 is sandwiched between the hard mask layer 300 and the light transmitting substrate 100. A first mask layer 400 is formed on the hard mask layer 300. In some embodiments, the structure illustrated in FIG. 1A is split into a first block B1 and a second block B2. The configurations of the first block B1 and the second block B2 will be discussed in greater detail later.

In some embodiments, the light transmitting substrate 100 may be formed of quartz glass, synthetic quartz glass, or fluorine-doped quartz glass. In some embodiments, the light transmitting substrate 100 is deemed transparent under near ultra violet (NUV) wavelengths (e.g., less than 365 nanometers (nm)). In some embodiments, the light transmitting substrate 100 is deemed transparent under deep ultra violet (DUV) wavelengths (e.g., less than 248 nm). In some embodiments, the light transmitting substrate 100 is deemed transparent under argon fluoride (ArF) laser (e.g., 193 nm).

In some embodiment, a material of the phase shift layer 200 includes chromium, chromium oxide, chromium oxynitride or another suitable material; a MoSi compound; or the like. The MoSi compound, for example, includes at least one among MoSi, MoSiCON, MoSiON, MoSiCN, MoSiCO, MoSiO, MoSiC, and MoSiN. As illustrated in FIG. 1A, the phase shift layer 200 is directly disposed on the light transmitting substrate 100 and immediately underneath the hard mask layer 300. However, the disclosure is not limited thereto. In some alternative embodiments, additional layer may be presented between the light transmitting substrate 100 and the phase shift layer 200 and/or between the phase shift layer 200 and the hard mask layer 300. In some embodiments, the phase shift layer 200 may be formed by a deposition process (such as chemical vapor deposition (CVD), physical vapor deposition (PVD), or atomic layer deposition (ALD)), a sputter method, or the like.

In some embodiments, the hard mask layer 300 is an opaque layer. A material of the hard mask layer 300 may include metals, metal oxides, or other suitable materials. For example, the hard masks layer 300 may be made of chrome (Cr), chrome oxide, chromium oxynitride, or another suitable material. The material of the hard mask layer 300 is not limited herein as long as such material is able to block incident light. Similar to the phase shift layer 200, in some embodiments, the hard mask layer 300 may also be formed through a deposition process (such as CVD, PVD, or ALD), a sputter method, or the like.

In some embodiments, the first mask layer 400 is utilized to pattern the underlying hard mask layer 300 in the subsequent processes. That is, the first mask layer 400 may be a photoresist layer. In some embodiments, the first mask layer 400 may be a chemically amplified resist that employs acid catalysis. For example, the first mask layer 400 may be formulated by dissolving an acid sensitive polymer in a casting solution. In some embodiments, the first mask layer 400 may be a positive tone photoresist which would render the patterns subsequently formed having the same contour as the patterns on a mask (not illustrated). In some alternative embodiments, the photoresist layer may be a negative tone photoresist which would render the patterns subsequently formed having openings corresponding to the patterns on the mask (not illustrated).

Referring to FIG. 1A, a first exposure process is performed on the first mask layer 400. In some embodiments, the first exposure process may include a lithography technique with a mask (for instance, a photolithography process) or a mask-less lithography technique (for instance, an electron-beam (e-beam) exposure process or an ion-beam exposure process). In some embodiments, the first exposure process is performed by irradiating a light beam onto at least a portion of the first mask layer 400 to form an exposure region 402. In some embodiments, the exposure region 402 is located in the first block B1. In other words, the first exposure process is performed within the first block B1.

Figure 1B:
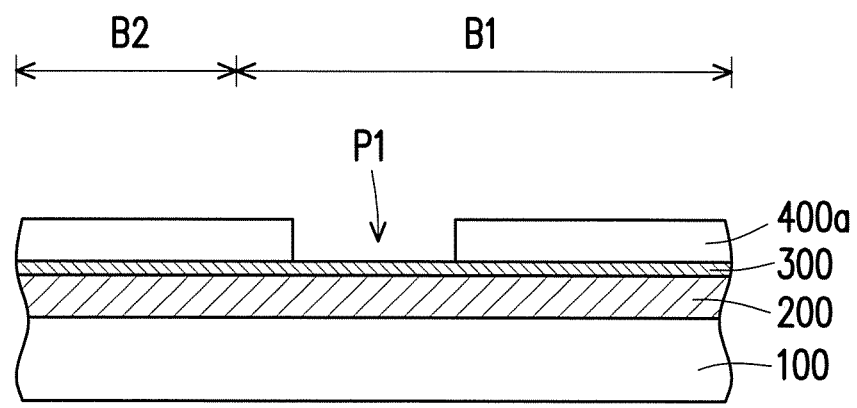

Referring to FIGS. 1A and 1B, after the first exposure process, a post-baking process may be performed to harden at least a portion of the first mask layer 400. Depending on the material(s) or type(s) of the first mask layer 400, polymers of the first mask layer 400 may undergo different reactions (chain scission or cross-linking of polymers) upon the irradiation of the light beam and baking. Thereafter, a first development process is performed to remove at least a portion of the first mask layer 400. In some embodiments, portions of the positive resist material exposed to the light beam may undergo chain scission reaction, resulting the exposed portions to be easily removed by a development agent as compared to other portions not exposed to the light beam. On the other hand, portions of the negative resist material exposed to the light beam may undergo the cross-linking reaction, resulting the exposed portions to be harder to remove by a development agent as compared to other portions not exposed to the light beam. In some embodiments, the first mask layer 400 is made of positive tone resist material, so the exposure region 402 is subjected to the chain scission reaction. Referring to FIG. 1B, the exposure region 402 is removed such that the first pattern P1 of the mask (not illustrated) is transferred onto the pattern first mask layer 400a. In some embodiments, the first pattern P1 of the patterned first mask layer 400a exposes at least a portion of the underlying hard mask layer 300.

Figure 1C:
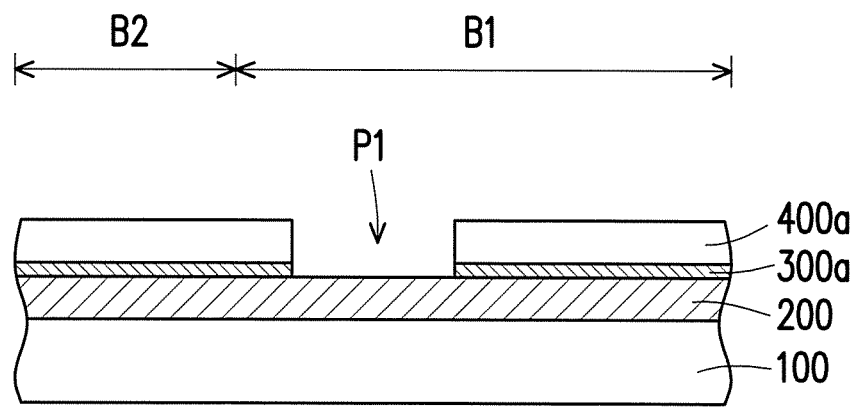

Referring to FIGS. 1B and 1C, a first etching process is performed to transfer the first pattern P1 onto the patterned hard mask layer 300a. For example, during the first etching process, the patterned first mask layer 400a may be adapted as a mask such that portions of the hard mask layer 300 exposed by the first pattern P1 is removed to render the patterned hard mask layer 300a having the first pattern P1. In some embodiments, the first etching process may be a selective etching process. In some embodiments, the first etching process may include a dry etching process, a wet etching process, or a combination thereof. In some embodiments, the first pattern P1 of the patterned hard mask layer 300a exposes at least a portion of the underlying phase shift layer 200.

Figure 1D:
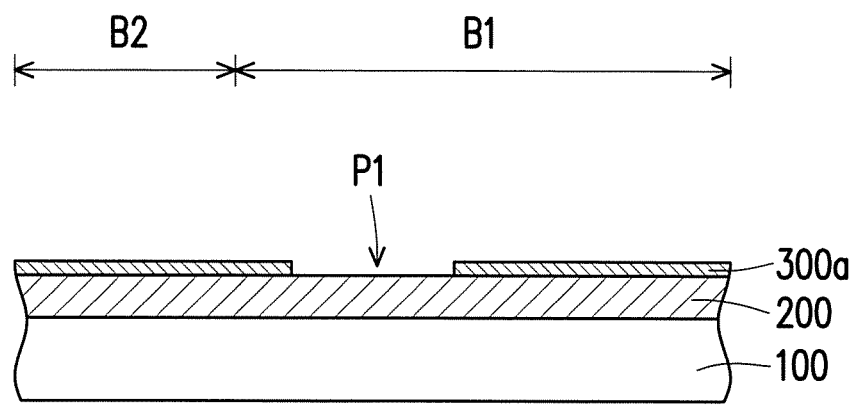

Referring to FIGS. 1C and 1D, the patterned first mask layer 400a is removed. The patterned first mask layer 400a may be removed through, for example, a resist stripping process or a resist ashing process. After the patterned first mask layer 400a is removed, the structure illustrated in FIG. 1D may further undergo a first inspection (after stripping inspection, ASI) process and a cleaning process. During the first inspection process, the first pattern P1 is inspected to ensure that the contour of the first pattern P1 is in accordance with the desired pattern (the pattern of the mask provided initially).

Figure 1E:
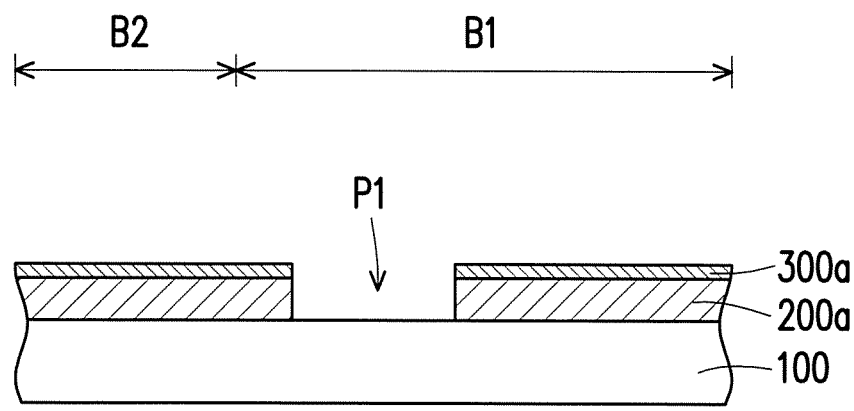

Referring to FIGS. 1D and 1E, an additional etching process is performed to transfer the first pattern P1 onto the patterned phase shift layer 200a. For example, during the additional etching process, the patterned hard mask layer 300a may be adapted as a mask such that portions of the phase shift layer 200 exposed by the first pattern P1 is removed to render the patterned phase shift layer 200a having the first pattern P1. Since the first pattern P1 of the patterned phase shift layer 200a is formed by adapting the patterned hard mask layer 300a as the mask, the contour of the first pattern P1 in the patterned phase shift layer 200a and the contour of the first pattern P1 in the patterned hard mask layer 300a are substantially identical and are aligned. In some embodiments, the additional etching process may include a dry etching process, a wet etching process, or a combination thereof. It should be noted that due to the material difference between the hard mask layer 300 and the phase shift layer 200, the etching recipe of the first etching process and the additional etching process may be different. In some embodiments, the steps illustrated in FIGS. 1A-1E may be collectively referred to as a first patterning process.

Figure 1F:
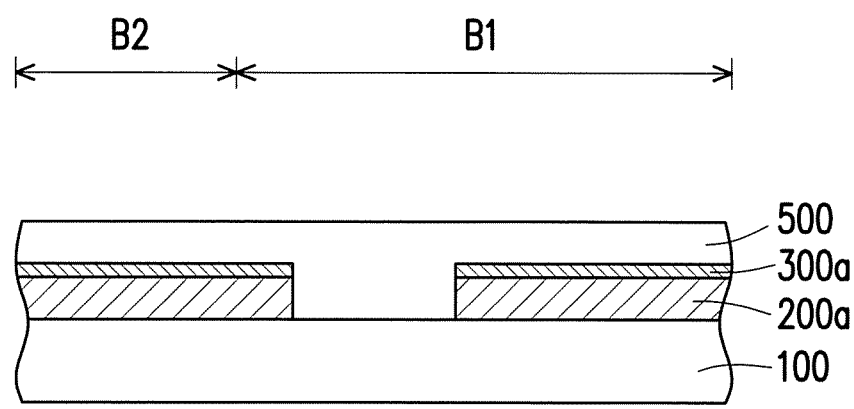

Referring to FIG. 1F, a second mask layer 500 is formed on the patterned hard mask layer 300a. A material and a formation method of the second mask layer 500 may be similar to the first mask layer 400, so the detailed description thereof is omitted herein.

Figure 1G:
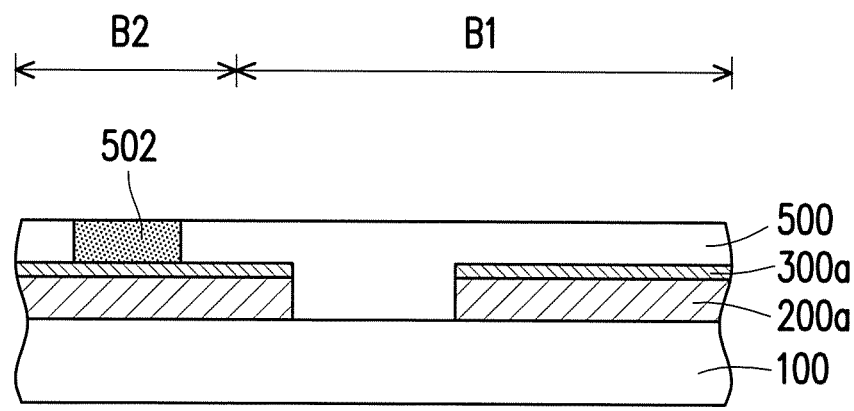

Referring to FIG. 1G, a second exposure process is performed on the second mask layer 500. The second exposure process may be similar to the first exposure process, so the detailed description thereof is omitted herein. In some embodiments, the second exposure process is performed by irradiating a light beam onto at least a portion of the second mask layer 500 to form an exposure region 502. In some embodiments, the exposure region 502 is located in the second block B2. In other words, the second exposure process is performed within the second block B2. In some embodiments, since the precision requirements of the patterns in the first block B1 and the second block B2 are different, the first exposure process and the second exposure process may be executed by different machines. For example, in some embodiments, if the patterns in the first block B1 require higher precision (having dense pitch or feature size) than the patterns in the second block B2, the first exposure process may be executed by a machine with higher resolution (advanced machine) while the second exposure process may be executed by a machine with lower resolution (lower grade machine). In some alternative embodiments, if the patterns in the first block B1 require lower precision than the patterns in the second block B2, the first exposure process may be executed by a machine with lower resolution while the second exposure process may be executed by a machine with higher resolution. As such, different machines may be fully utilized to reduce the manufacturing time by 8%-20%, thereby increasing the throughput of the photomask. Examples of the patterns requiring lower precision include dummy pattern, trivial pattern, or the like. It should be noted that the foregoing procedure adapted lithography technique with a mask as an example, but the disclosure is not limited thereto. In a case where mask-less lithography technique is adapted, different writers may be utilized to form the patterns in the first block B1 and the patterns in the second block B2.

Figure 1H:
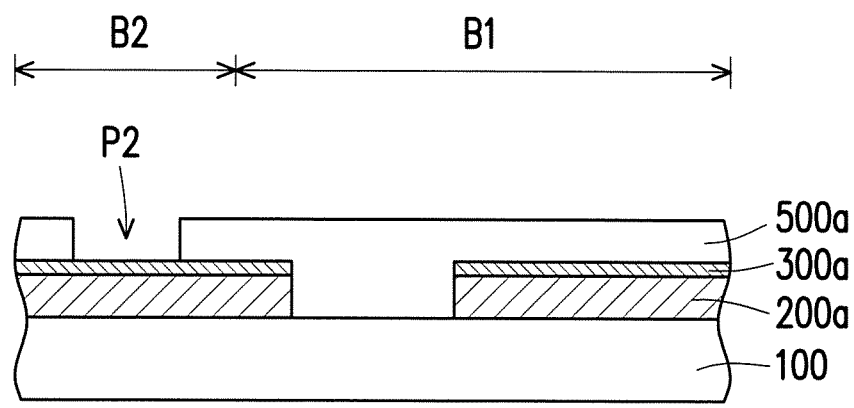

Referring to FIGS. 1G and 1H, a second development process is performed to remove at least a portion of the second mask layer 500. In some embodiments, the exposure region 502 is removed such that the second pattern P2 of the mask (not illustrated) is transferred onto the pattern second mask layer 500a. In some embodiments, the second pattern P2 of the patterned second mask layer 500a exposes at least a portion of the underlying patterned hard mask layer 300a.

Figure 1I:
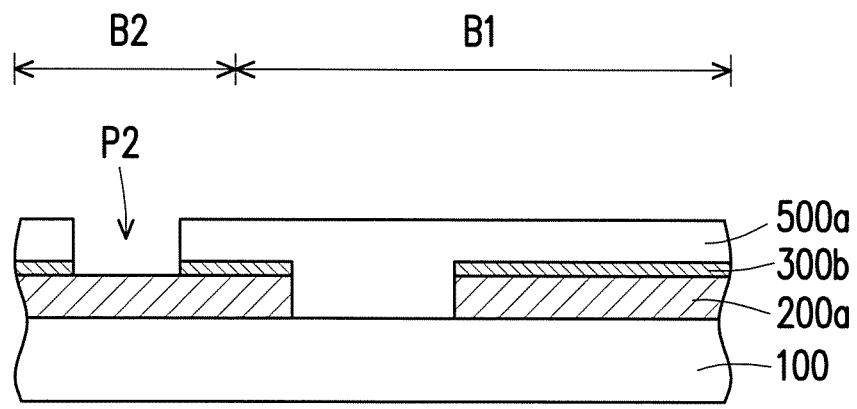

Referring to FIGS. 1H and 1I, a second etching process is performed to transfer the second pattern P2 onto the patterned hard mask layer 300b. For example, during the second etching process, the patterned second mask layer 500a may be adapted as a mask such that portions of the patterned hard mask layer 300a exposed by the second pattern P2 is removed to render the patterned hard mask layer 300b having the second pattern P2. In some embodiments, the second etching process may include a dry etching process, a wet etching process, or a combination thereof. In some embodiments, the recipe of the second etching process may be identical to the first etching process. In some alternative embodiments, the second etching process may be different from the first etching process. In some embodiments, the second pattern P2 of the patterned hard mask layer 300b exposes at least a portion of the underlying patterned phase shift layer 200a.

Figure 1J:
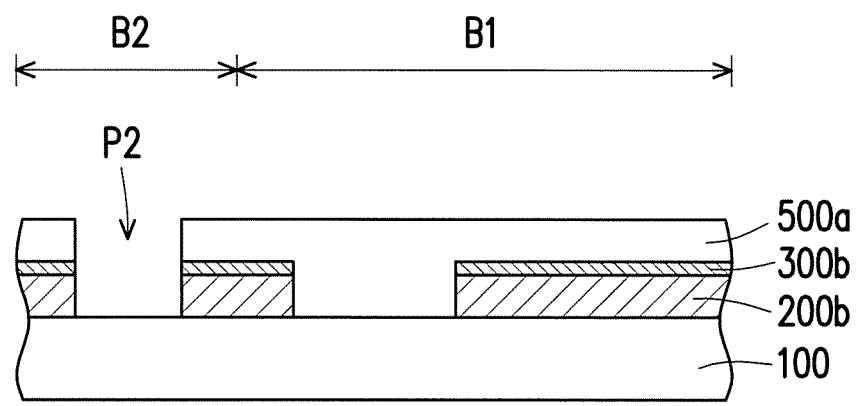

Referring to FIGS. 1I and 1J, a third etching process is performed to transfer the second pattern P2 onto the patterned phase shift layer 200b. For example, during the third etching process, the patterned second mask layer 500a and the patterned hard mask layer 300b may be adapted as masks such that portions of the patterned phase shift layer 200a exposed by the second pattern P2 is removed to render the patterned phase shift layer 200b having the second pattern P2. Since the second pattern P2 of the patterned phase shift layer 200b is formed by adapting the patterned hard mask layer 300b as the mask, the contour of the second pattern P2 in the patterned phase shift layer 200b and the contour of the second pattern P2 in the patterned hard mask layer 300b are substantially identical and are aligned. In some embodiments, the third etching process may include a dry etching process, a wet etching process, or a combination thereof. It should be noted that due to the material difference between the hard mask layer 300 and the phase shift layer 200, the etching recipe of the second etching process and the third etching process may be different. In some embodiments, the recipe of the third etching process may be identical to the first etching process and/or the additional etching process. In some alternative embodiments, the third etching process may be different from the first etching process or the additional etching process.

Figure 1K:
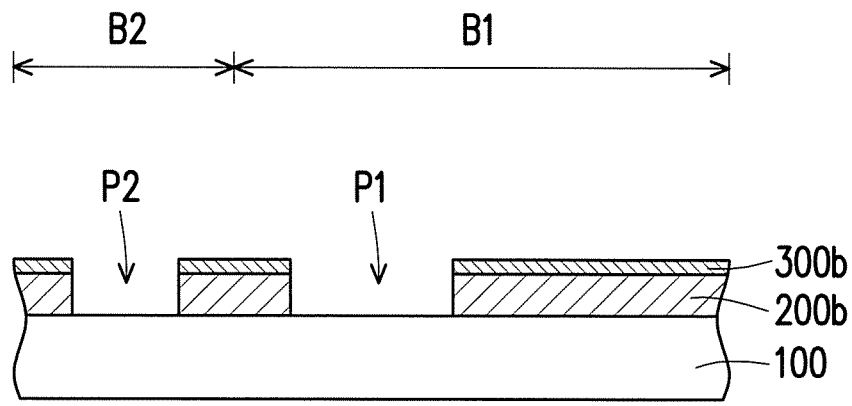

Referring to FIGS. 1J and 1K, the patterned second mask layer 500a is removed. The patterned second mask layer 500a may be removed through, for example, a resist stripping process or a resist ashing process. After the patterned second mask layer 500a is removed, the structure illustrated in FIG. 1K may further undergo a cleaning process. In some embodiments, the steps illustrated in FIGS. 1F-1K may be collectively referred to as a second patterning process.

Figure 1L:
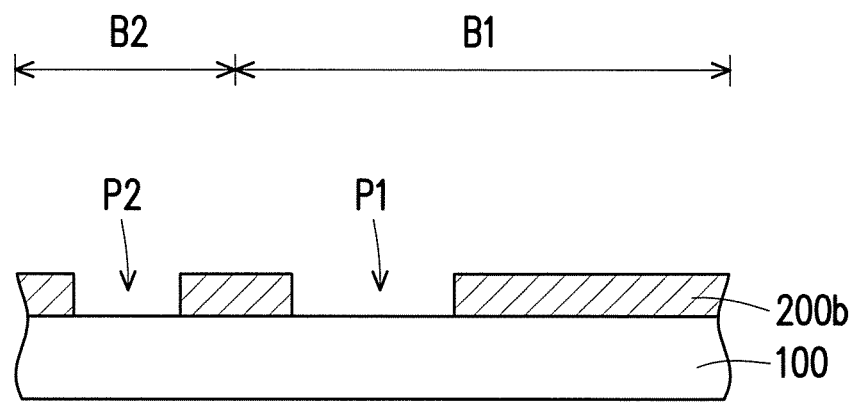

Referring to FIGS. 1K and 1L, the patterned hard mask layer 300b is removed to obtain the photomask 10A. As illustrated in FIG. 1L, after the patterned hard mask layer 300b is removed, regions of the light transmitting substrate 100 corresponding to the first pattern P1 and the second pattern P2 are exposed by the patterned phase shift layer 200b. The photomask 10A has a predetermined mask pattern P which is split into a first pattern P1 and a second pattern P2. The first pattern P1 is located in the first block B1 and the second pattern P2 is located in the second block B2. In some embodiments, after the patterned hard mask layer 300b is removed, the photomask 10A may be subject to a second inspection process. During the second inspection process, the second pattern P2 is inspected to ensure that the contour of the second pattern P2 is in accordance with the desired pattern (the pattern of the mask provided initially). As mentioned above, the first pattern P1 and the second pattern P2 may be formed by different machines due to the difference in precision requirements. Similarly, in some embodiments, the first inspection process and the second inspection process may be performed by inspection machines with different precisions.

In some embodiments, the photomask 10A may be referred to as a super binary mask (SBIM). The SBIM includes the light transmitting substrate 100 and the patterned phase shift layer 200b. During the photolithography process, patterns are transferred to a surface of a wafer by transmitting light through the light transmitting substrate and a small percentage of light incident on the phase shift layer propagates through the patterned phase shift layer 200b, to selectively expose a photomask layer on a wafer. In some embodiments, from about 6% to about 9% of incident light propagates through the patterned phase shift layer 200b. In some other embodiments, about 12% of incident light propagates through the patterned phase shift layer 200b. Further, the patterned phase shift layer 200b is used to shift a phase of selected light passing through the mask or the reticle by $\pi$ (180 degrees), thereby the undesired light is offset by the destructive interference. Removing the undesired light helps to improve the precision of the image transfer. In some embodiments where the mask is a super binary mask, a thickness of the patterned phase shift layer 200b is greater than 40 nm. However, one of ordinary skill in the art would understand that the thickness of the opaque layer is determined by a transmission rate of the selected material and a depth of focus (DOF) during the process.

Figure 2A:
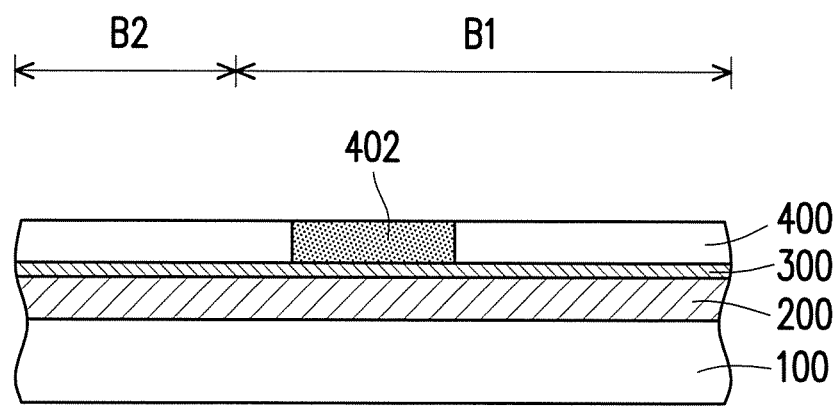
FIGS. 2A-2O are schematic cross-sectional views illustrating a process flow for manufacturing a photomask in accordance with some alternative embodiments of the disclosure.
Figure 2B:
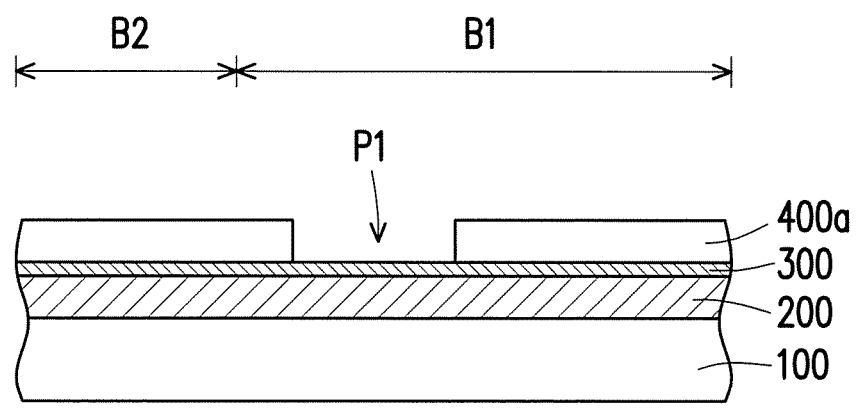
Figure 2C:
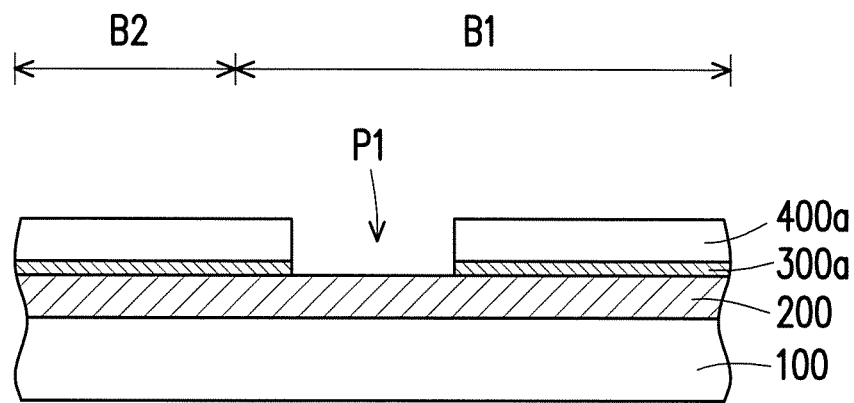
Figure 2D:
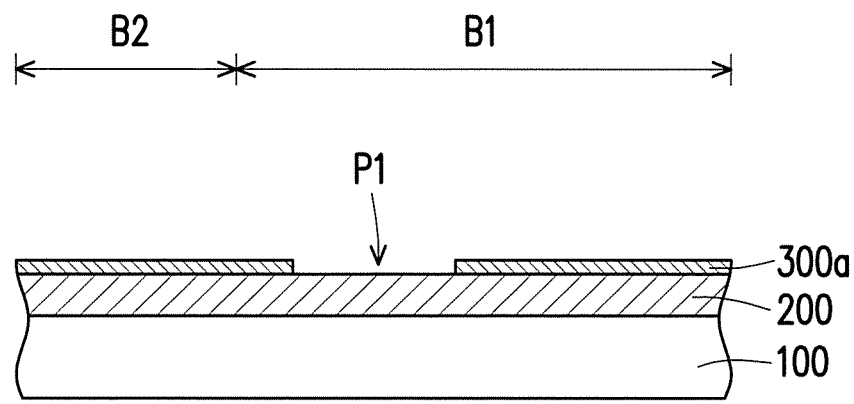
Figure 2E:
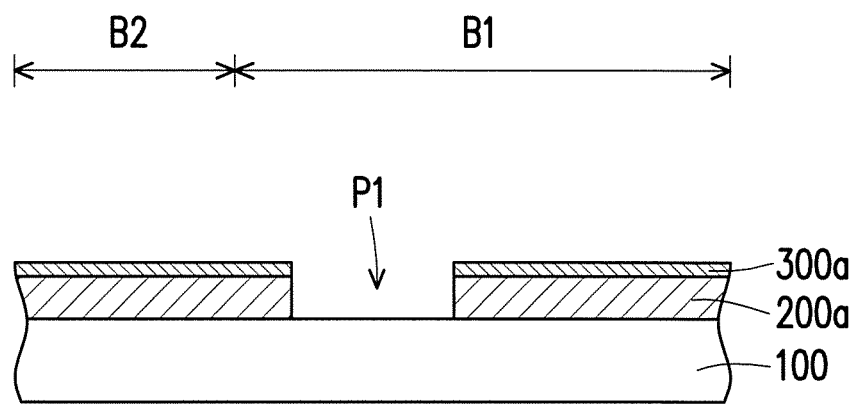
Figure 2F:
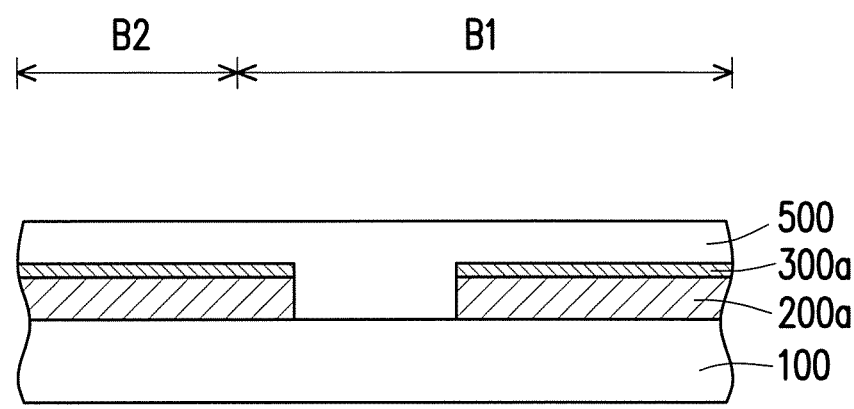

FIGS. 2A-2O are schematic cross-sectional views illustrating a process flow for manufacturing a photomask 10B in accordance with some alternative embodiments of the disclosure. Referring to FIGS. 2A-2F, the steps described herein is similar to the steps of FIGS. 1A-1F, so the detailed description thereof is omitted herein.

Figure 2G:
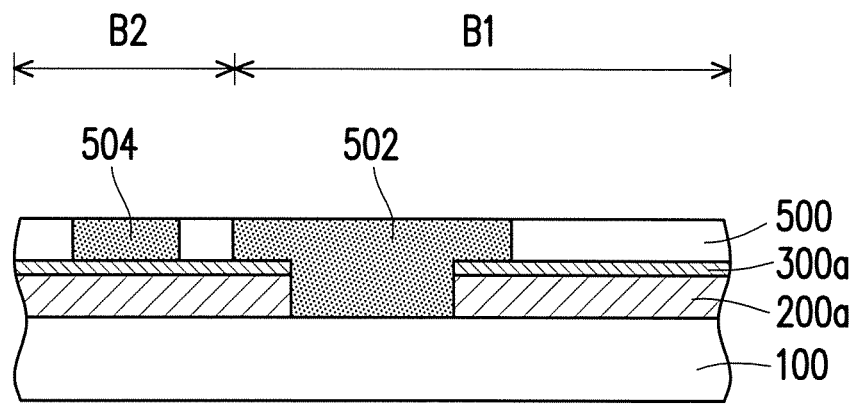

Referring to FIG. 2G, a second exposure process is performed on the second mask layer 500. The second exposure process may be similar to the first exposure process, so the detailed description thereof is omitted herein. In some embodiments, the second exposure process is performed by irradiating a light beam onto at least a portion of the second mask layer 500 to form an exposure region 502 and an exposure region 504. In some embodiments, the exposure region 502 is located in the first block B1 and the exposure region 504 is located in the second block B2. In other words, the second exposure process is performed on both of the first block B1 and the second block B2. In some embodiments, the exposure region 502 is formed to be partially overlapped with the first pattern P1.

Figure 2H:
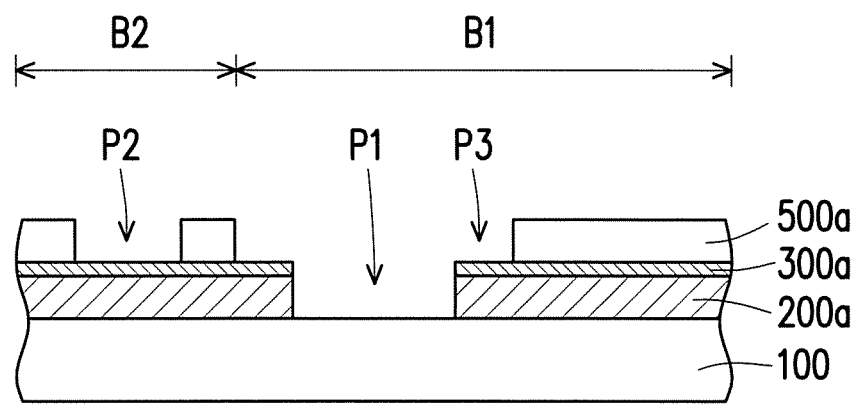

Referring to FIGS. 2G and 2H, a second development process is performed to remove at least a portion of the second mask layer 500. In some embodiments, the exposure region 502 and the exposure region 504 are removed such that the third pattern P3 and the second pattern P2 of the mask (not illustrated) are respectively transferred onto the pattern second mask layer 500a. In some embodiments, the second pattern P2 and the third pattern P3 of the patterned second mask layer 500a exposes at least a portion of the underlying patterned hard mask layer 300a. In some embodiments, the third pattern P3 of the patterned second mask layer 500a is partially overlap with the first pattern P1. In other words, the third pattern P3 also exposes the first pattern P1.

Figure 2I:
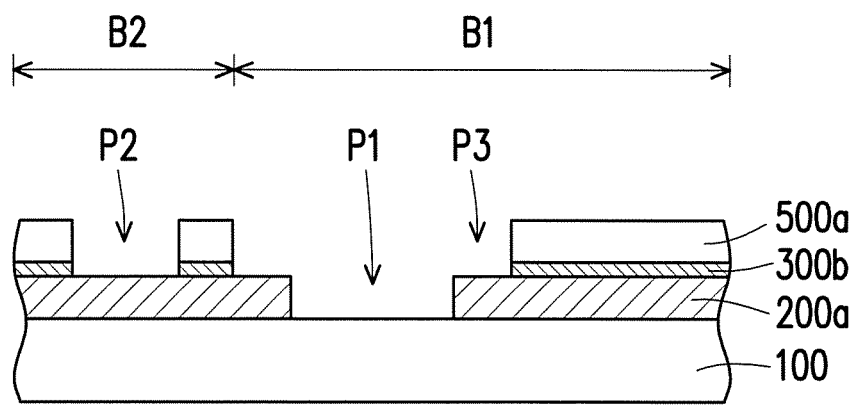

Referring to FIGS. 2H and 2I, a second etching process is performed to transfer the second pattern P2 and the third pattern P3 onto the patterned hard mask layer 300b. For example, during the second etching process, the patterned second mask layer 500a may be adapted as a mask such that portions of the patterned hard mask layer 300a exposed by the second pattern P2 and the third pattern P3 is removed to render the patterned hard mask layer 300b having the second pattern P2 and the third pattern P3. In some embodiments, the recipe of the second etching process may be identical to the first etching process. In some alternative embodiments, the second etching process may be different from the first etching process. In some embodiments, the second pattern P2 and the third pattern P3 of the patterned hard mask layer 300b expose at least a portion of the underlying patterned phase shift layer 200a. In addition, the third pattern P3 also exposes the first pattern P1.

Figure 2J:
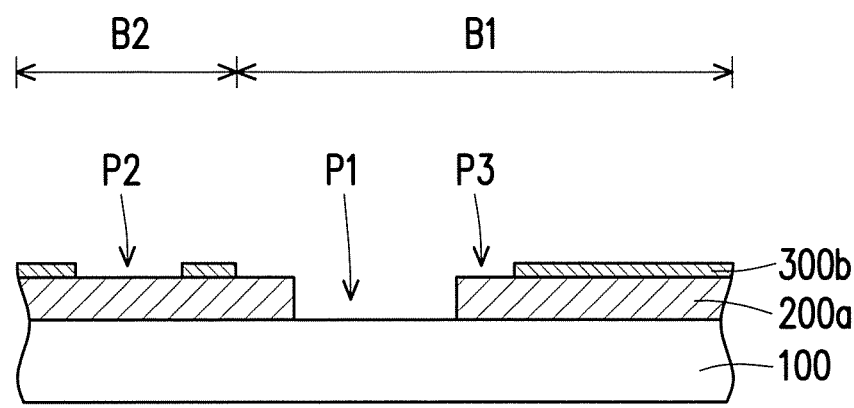

Referring to FIGS. 2I and 2J, the patterned second mask layer 500a is removed. The patterned second mask layer 500a may be removed through, for example, a resist stripping process or a resist ashing process. After the patterned second mask layer 500a is removed, the structure illustrated in FIG. 2J may further undergo a cleaning process. In some embodiments, the steps illustrated in FIGS. 2F-2J may be collectively referred to as a second patterning process.

Figure 2K:
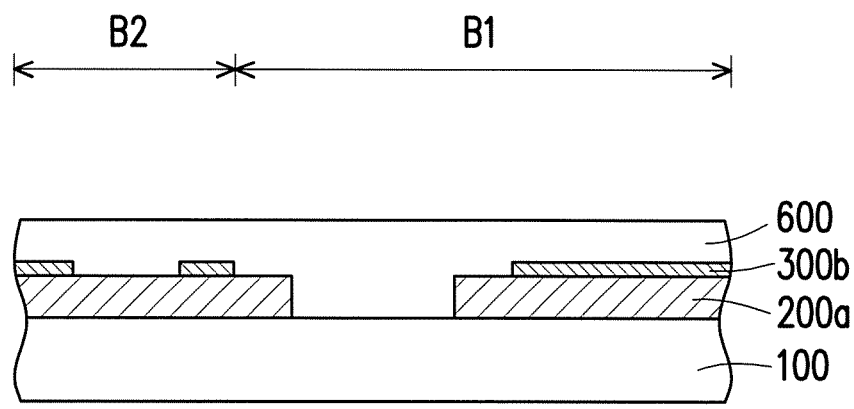

Referring to FIG. 2K, a third mask layer 600 is formed on the patterned hard mask layer 300b. A material and a formation method of the third mask layer 600 may be similar to the first mask layer 400 and the second mask layer 500, so the detailed description thereof is omitted herein.

Figure 2L:
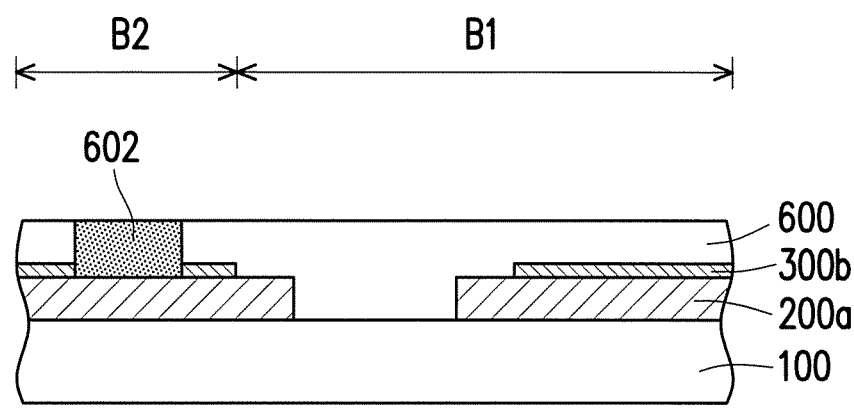

Referring to FIG. 2L, a third exposure process is performed on the third mask layer 600. The third exposure process may be similar to the first exposure process and the second exposure process, so the detailed description thereof is omitted herein. In some embodiments, the third exposure process is performed by irradiating a light beam onto at least a portion of the third mask layer 600 to form an exposure region 602. In some embodiments, the exposure region 602 is located in the second block B2. For example, the exposure region 602 may be aligned with the second pattern P2 of the patterned hard mask layer 300b. In other words, the third exposure process is performed within the second block B2. In some embodiments, the first exposure process, the second exposure process, and the third exposure process may be executed by different machines. However, the disclosure is not limited thereto. In some alternative embodiments, the first exposure process and the third exposure process may be executed by the same machine while the second exposure process may be executed by a different machine.

Figure 2M:
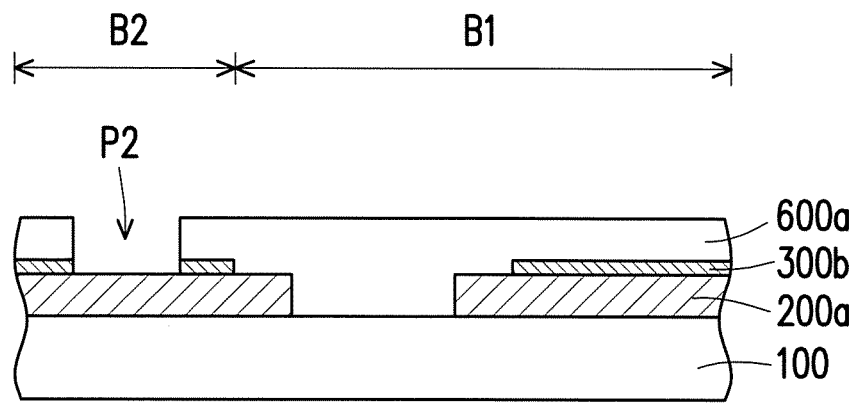

Referring to FIGS. 2L and 2M, a third development process is performed to remove at least a portion of the third mask layer 600. In some embodiments, the exposure region 602 is removed such that the second pattern P2 of the mask (not illustrated) is transferred onto the pattern third mask layer 600a. In some embodiments, the second pattern P2 of the patterned third mask layer 600a exposes at least a portion of the underlying patterned phase shift layer 200a.

Figure 2N:
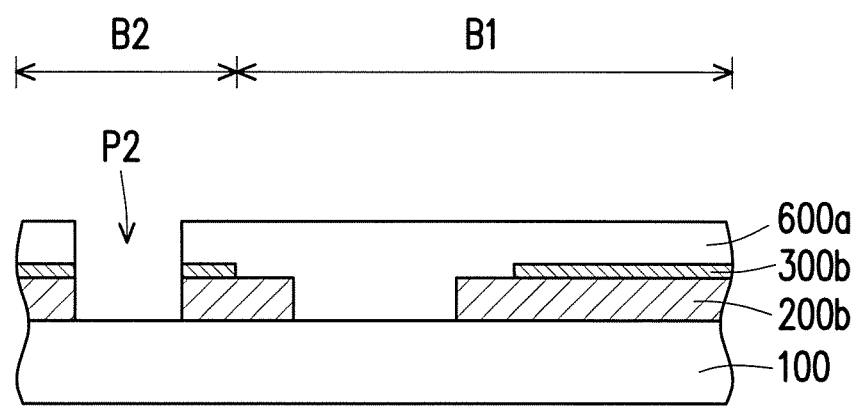
Figure 20:
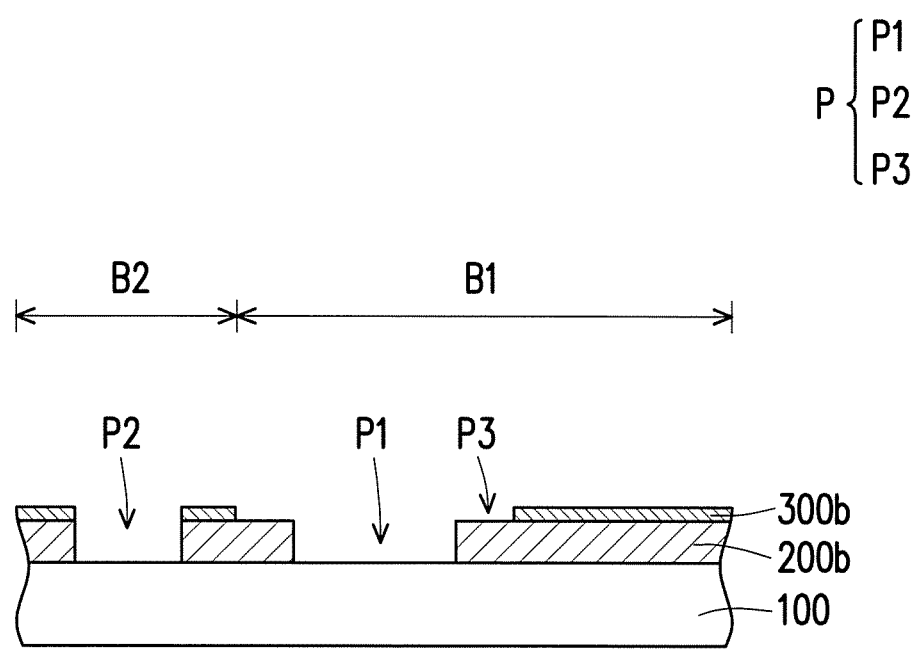

Referring to FIGS. 2M and 2N, a third etching process is performed to transfer the second pattern P2 onto the patterned phase shift layer 200b. For example, during the third etching process, the patterned third mask layer 600a and the patterned hard mask layer 300b may be adapted as masks such that portions of the patterned phase shift layer 200a exposed by the second pattern P2 is removed to render the patterned phase shift layer 200b having the second pattern P2. Since the second pattern P2 of the patterned phase shift layer 200b is formed by adapting the patterned hard mask layer 300b as the mask, the contour of the second pattern P2 in the patterned phase shift layer 200b and the contour of the second pattern P2 in the patterned hard mask layer 300b are substantially identical and are aligned. It should be noted that due to the material difference between the hard mask layer 300 and the phase shift layer 200, the etching recipe of the second etching process and the third etching process may be different.

Referring to FIGS. 2N and 2O, the patterned third mask layer 600a is removed to obtain the photomask 10B. The patterned third mask layer 600a may be removed through, for example, a resist stripping process or a resist ashing process. In some embodiments, the steps illustrated in FIGS. 1K-1O may be collectively referred to as a third patterning process.

As illustrated in FIG. 2O, regions of the light transmitting substrate 100 corresponding to the first pattern P1 and the second pattern P2 are exposed. Similarly, the patterned phase shift layer 200b corresponding to the third pattern P3 is exposed. The photomask 10B has a predetermined mask pattern P which is split into a first pattern P1, a second pattern P2, and a third pattern P3. The first pattern P1 and the third pattern P3 are located in the first block B1 and the second pattern P2 is located in the second block B2.

In some embodiments, the photomask 10B may be referred to as a phase shift mask (PSM). The PSM is used to shift a phase of selected light passing through the mask or the reticle by $\pi$ (180 degrees), thereby the undesired light is offset by the destructive interference. Removing the undesired light helps to improve the precision of the image transfer. Typically, the PSM is categorized into an attenuated PSM. In some embodiments, the photomask 10B may be referred to as an attenuated PSM. In an attenuated PSM, portions of the light transmitting substrate 100 are covered by a patterned phase shift layer 200a. A small percentage, e.g., from about 6% to about 9%, of light incident on the phase shift layer propagates through the phase shift layer. In some embodiments, about 12% of incident light propagates through the patterned phase shift layer 200a. Regions of the light transmitting substrate 100 of the attenuated PSM which are exposed by the patterned phase shift layer 200a permit about 99% of incident light to propagate through the light transmitting substrate. In some embodiments where the photomask is an attenuated PSM, a thickness of the opaque layer (for example, the patterned hard mask layer 300b) ranges from about 5 nm to about 80 nm. A greater thickness increases absorption of incident light, thereby providing insufficient light intensity, in some instances. However, one of ordinary skill in the art would understand that the thickness of the opaque layer is determined by a transmission rate of the selected material and a DOF during the process. In some embodiments, based on a wavelength of a light source, a thickness of the patterned phase shift layer 200a ranges from about 40 nm to about 1000 nm. A greater or smaller thickness increases a deviation from a phase shift by $\pi$, reducing a pattern resolution, in some instances. However, one of ordinary skill in the art would understand that the thickness of the phase shift layer is determined by a transmission rate of the selected material, wavelength of the light source, and a DOF during the process. For example, when the patterned phase shift layer includes molybdenum and silicon oxynitride, the thickness of the phase shifter ranges from about 40 nm to about 100 nm.

Figure 3A:
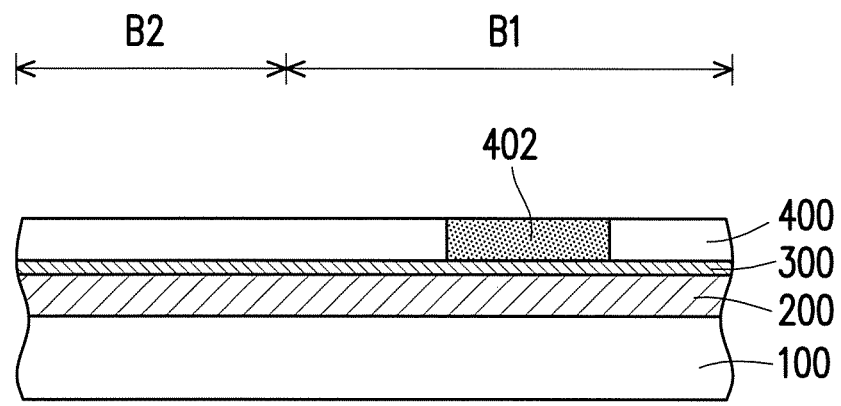
FIGS. 3A-3G are schematic cross-sectional views illustrating a process flow for manufacturing a photomask in accordance with some alternative embodiments of the disclosure.

FIGS. 3A-3G are schematic cross-sectional views illustrating a process flow for manufacturing a photomask 10C in accordance with some alternative embodiments of the disclosure. Referring to FIG. 3A, the step described herein is similar to the step of FIG. 1A, so the detailed description thereof is omitted herein. In some embodiments, a first exposure process is performed on the first mask layer 400 within the first block B1 to render an exposure region 402.

Figure 3B:
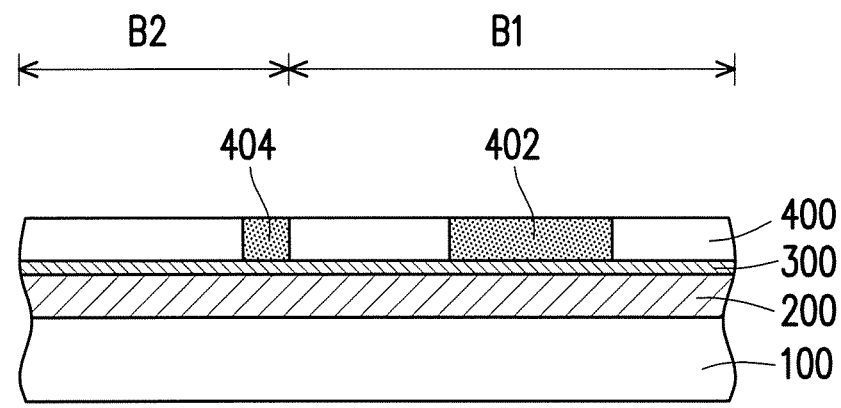

Referring to FIG. 3B, a second exposure process is performed on the first mask layer 400 within the second block B2 to render an exposure region 404. In some embodiments, since the precision requirements of the patterns in the first block B1 and the second block B2 are different, the first exposure process and the second exposure process may be executed by different machines. For example, in some embodiments, if the patterns in the first block B1 require higher precision (having dense pitch or feature size) than the patterns in the second block B2, the first exposure process may be executed by a machine with higher resolution (advanced machine) while the second exposure process may be executed by a machine with lower resolution (lower grade machine). In some alternative embodiments, if the patterns in the first block B1 require lower precision than the patterns in the second block B2, the first exposure process may be executed by a machine with lower resolution while the second exposure process may be executed by a machine with higher resolution. As such, different machines may be fully utilized to reduce the manufacturing time by 20%-50%, thereby increasing the throughput of the photomask.

Figure 3C:
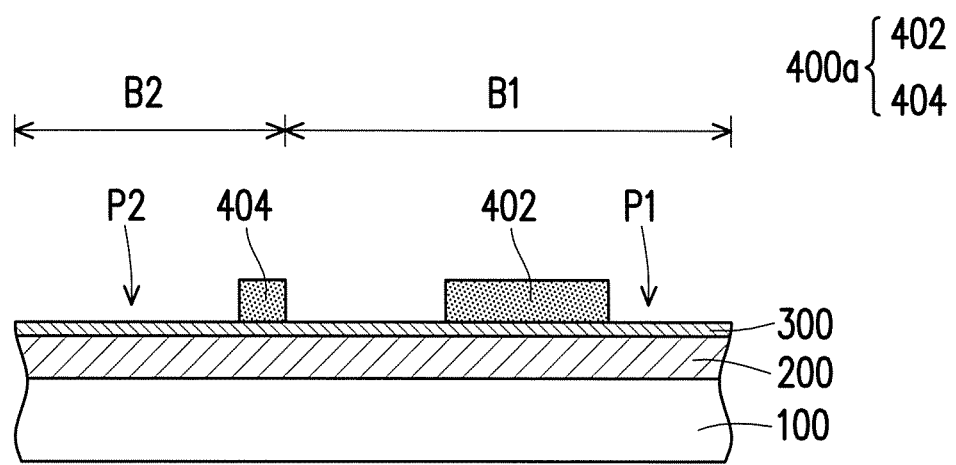

Referring to FIGS. 3B and 3C, after the first exposure process and the second exposure process, a post-baking process may be performed to harden at least a portion of the first mask layer 400. Depending on the material(s) or type(s) of the first mask layer 400, polymers of the first mask layer 400 may undergo different reactions (chain scission or cross-linking of polymers) upon the irradiation of the light beam and baking. Thereafter, a first development process is performed to remove at least a portion of the first mask layer 400. In some embodiments, the first mask layer 400 is made of negative tone resist material, so the exposure region 402 and the exposure region 404 are subjected to the cross-linking reaction. Referring to FIG. 3C, the first mask layer 400 other than the exposure regions 402, 404 is removed such that the first pattern P1 and the second pattern P2 of the mask (not illustrated) are transferred onto the pattern first mask layer 400a. In some embodiments, the first pattern P1 and the second pattern P2 of the patterned first mask layer 400a exposes at least a portion of the underlying hard mask layer 300.

Figure 3D:
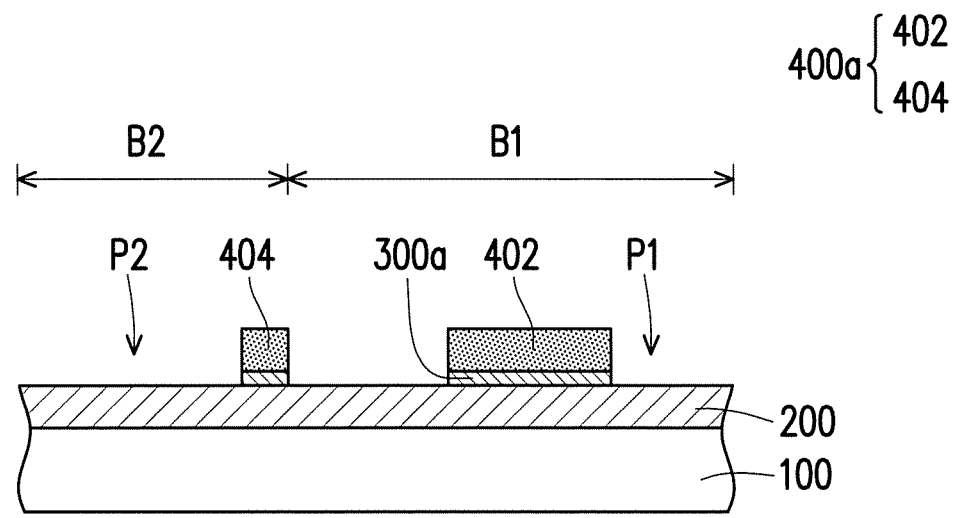

Referring to FIGS. 3C and 3D, a first etching process is performed to transfer the first pattern P1 and the second pattern P2 onto the patterned hard mask layer 300a. For example, during the first etching process, the patterned first mask layer 400a may be adapted as a mask such that portions of the hard mask layer 300 exposed by the first pattern P1 and the second pattern P2 is removed to render the patterned hard mask layer 300a having the first pattern P1 and the second pattern P2. In some embodiments, the first pattern P1 and the second pattern P2 of the patterned hard mask layer 300a exposes at least a portion of the underlying phase shift layer 200.

Figure 3E:
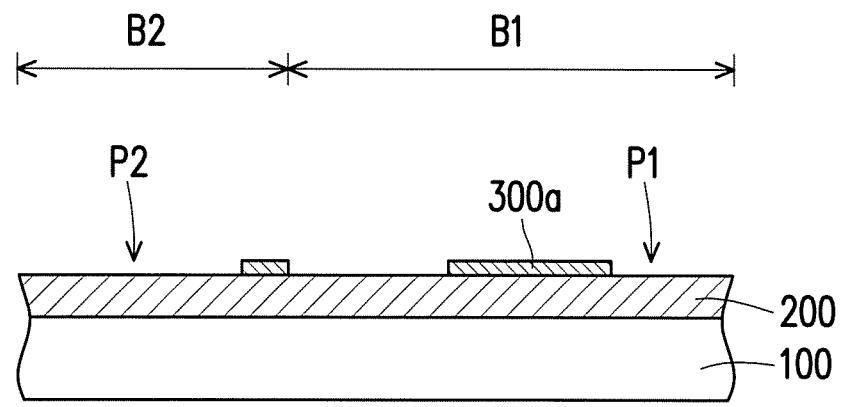

Referring to FIGS. 3D and 3E, the patterned first mask layer 400a is removed. The patterned first mask layer 400a may be removed through, for example, a resist stripping process or a resist ashing process. After the patterned first mask layer 400a is removed, the structure illustrated in FIG. 3E may further undergo an inspection process and a cleaning process. During the inspection process, the first pattern P1 and the second pattern P2 are inspected to ensure that the contour of the first pattern P1 and the second pattern P2 are in accordance with the desired pattern (the pattern of the mask provided initially).

Figure 3F:
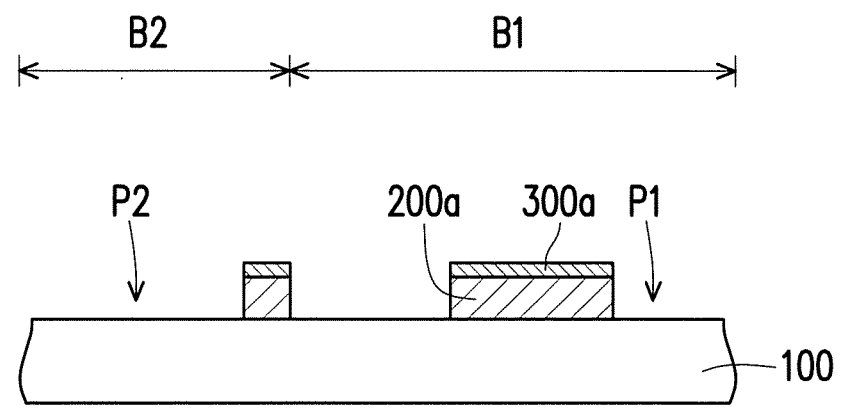

Referring to FIGS. 3E and 3F, a second etching process is performed to transfer the first pattern P1 and the second pattern P2 onto the patterned phase shift layer 200a. For example, during the second etching process, the patterned hard mask layer 300a may be adapted as a mask such that portions of the phase shift layer 200 exposed by the first pattern P1 and the second pattern P2 is removed to render the patterned phase shift layer 200a having the first pattern P1 and the second pattern P2. Since the first pattern P1 of the patterned phase shift layer 200a is formed by adapting the patterned hard mask layer 300a as the mask, the contour of the first pattern P1 in the patterned phase shift layer 200a and the contour of the first pattern P1 in the patterned hard mask layer 300a are substantially identical and are aligned. Similarly, the contour of the second pattern P2 in the patterned phase shift layer 200a and the contour of the second pattern P2 in the patterned hard mask layer 300a are substantially identical and are aligned. It should be noted that due to the material difference between the hard mask layer 300 and the phase shift layer 200, the etching recipe of the first etching process and the second etching process may be different.

Figure 3G:
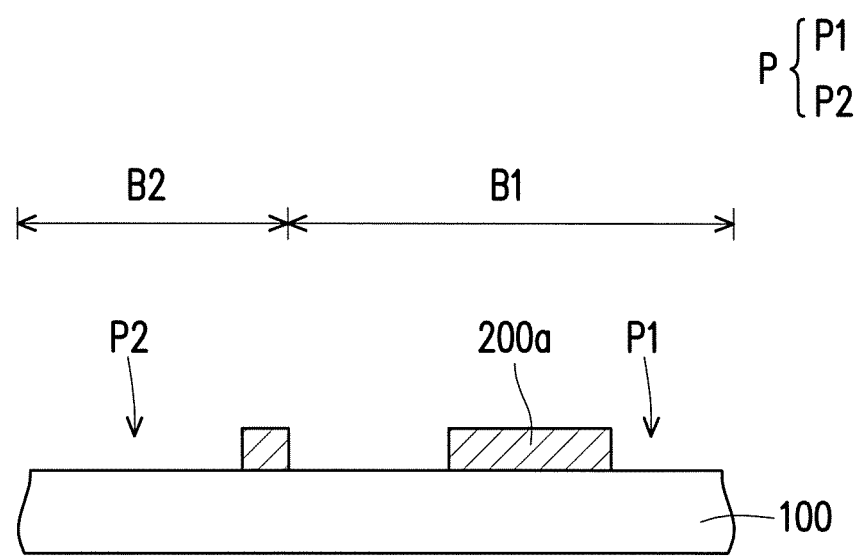

Referring to FIGS. 3F and 3G, the patterned hard mask layer 300a is removed to obtain the photomask 10C. As illustrated in FIG. 3G, after the patterned hard mask layer 300a is removed, regions of the light transmitting substrate 100 corresponding to the first pattern P1 and the second pattern P2 are exposed by the patterned phase shift layer 200a. The photomask 10C has a predetermined mask pattern P which is split into a first pattern P1 and a second pattern P2. The first pattern P1 is located in the first block B1 and the second pattern P2 is located in the second block B2. In some embodiments, the photomask 10C may be referred to as a super binary mask (SBIM).

Figure 5A:
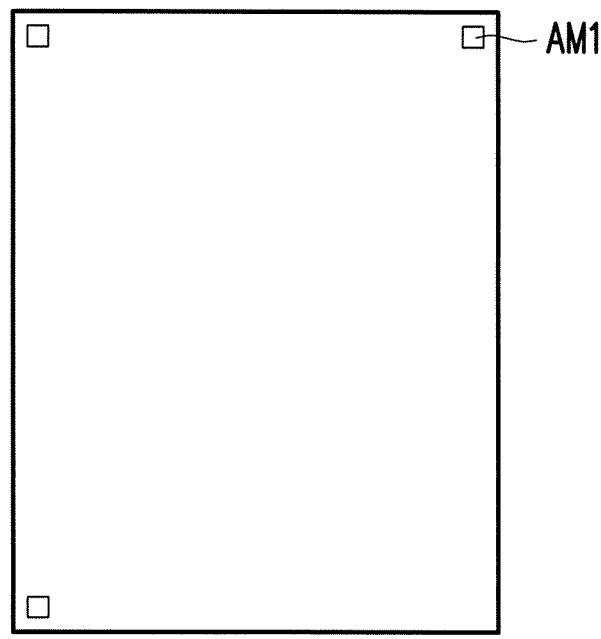
FIG. 5A is a schematic top view illustrating a first mask layer during the first exposure process in FIG. 3A.
Figure 5B:
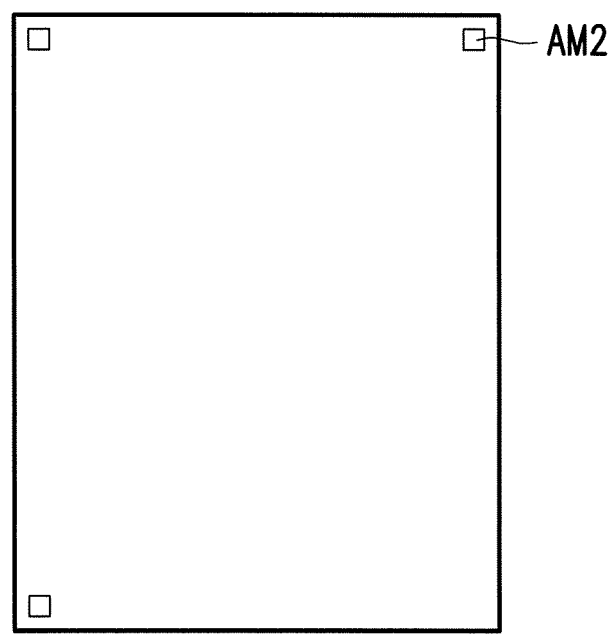
FIG. 5B is a schematic top view illustrating a first mask layer during the second exposure process in FIG. 3B.

It should be noted that FIGS. 3A-3G presented above mainly focus on the formation of patterns. Optionally, in some embodiments, a plurality of marks (alignment marks) are also formed at the same time as the first pattern P1 and the second pattern P2 are formed. The detailed descriptions with respect to alignment mark is presented herein. FIG. 5A is a schematic top view illustrating a first mask layer 400 during the first exposure process in FIG. 3A. FIG. 5B is a schematic top view illustrating a first mask layer 400 during the second exposure process in FIG. 3B.

Referring to FIG. 5A, during the first exposure process as described in FIG. 3A, a plurality of first marks AM1 are formed in the first mask layer 400. In some embodiments, the first marks AM1 are formed at the corner of the first mask layer 400. In some alternative embodiments, the first marks AM1 are formed at the edge region of the first mask layer 400. The positions of the first marks AM1 are not particularly limited as long as the first marks AM1 do not disrupt the first patterns P1 and the second patterns P2. Referring to FIG. 5B, during the second exposure process as described in FIG. 3B, a plurality of second marks AM2 are also formed in the second mask layer 400. In some embodiments, the second marks AM2 are desired to be formed at the same positions as that of the first marks AM1. In some embodiments, the second marks AM2 are formed at the corner of the second mask layer 500. In some alternative embodiments, the second marks AM2 are formed at the edge region of the second mask layer 500.

Subsequently, during the first development process as described in FIG. 3C, the first marks AM1 and the second marks AM2 are transferred onto the patterned first mask layer 400. Thereafter, during the steps of FIGS. 3D-3F, the first marks AM1 and the second marks AM2 are transferred onto the patterned phase shift layer 200a and the patterned hard mask layer 300a based on the same manner as that of the first pattern P1 and the second pattern P2. In other words, the first marks AM1 and the second marks AM2 are located at corners or edge regions of the patterned phase shift layer 200a and the patterned hard mask layer 300a. It should be noted that the first marks AM1 and the second marks AM2 are not illustrated in FIGS. 3A-3F since the cross-sectional line does not pass through the positions where the first marks AM1 and the second marks AM2 are located. Moreover, although FIG. 5A illustrated three first marks AM1 and FIG. 5B illustrated three second marks AM2, the number of the first marks AM1 and the second marks AM2 is not limited thereto. In some alternative embodiments, more or less first marks AM1 and second marks AM2 may be formed during the first exposure process and the second exposure process.

Ideally, after the photomask 10C is obtained, a number of the first marks AM1 should be the same as a number of the second marks. Meanwhile, the first marks AM1 and the second marks AM2 should completely overlap with each other in a thickness direction (z-direction). However, in some embodiments, due to errors of the machinery, the first marks AM1 and the second marks AM2 may not necessarily completely overlap with each other or may not necessarily have the same number. Under this scenario, a runout (ASI/Runout) process is performed after the photomask 10C is obtained. For example, the ASI/Runout process may be performed to calculate a deviation between the first exposure process and the second exposure process based on a distance between each of the first marks AM1 and each of the second marks AM2. During the ASI/Runout process, if the distance is within a set range, the predetermined mask pattern P is indicated as aligned. On the other hand, if the distance is not within the set range, the predetermined mask pattern P is indicated as misaligned. It should be noted that the term "aligned" and the term "misaligned" is referring to the relationship between the predetermined mask pattern P obtained and the pattern on the mask initially provided for manufacturing the photomask 10C. In some embodiments, the set range may be 300 μm in both the x-direction and the y-direction. In some embodiments, as compared to the conventional alignment marks, a number of the first marks AM1 and the second marks AM2 may be reduced. For example, unnecessary alignment marks in the conventional photomask not being used by the exposure machines may be omitted in the disclosure. As such, the throughput of the photomask may be further enhanced.

Figure 5C:
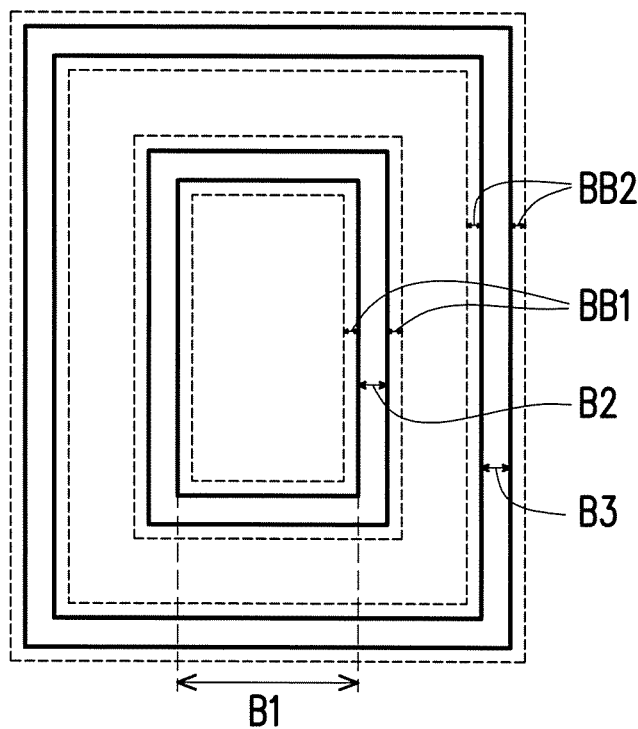
FIG. 5C is a schematic top view illustrating a portion of a photomask.

In some embodiments, in order to prevent the mismatch patterning that existed inherently due to variation between each machines (for example, the machine performing the first exposure process and the machine performing the second exposure process), a buffer block may be presented to surround the blocks in which lower resolution patterns are formed. FIG. 5C is a schematic top view illustrating a portion of a photomask. Referring to FIG. 5C, the photomask is divided into a first block B1, a second block B2, and a third block B3. The second block B2 surrounds the first block B1 and the third block B3 surrounds the second block B2. In some embodiments, the first block B1 may include high resolution patterns. On the other hand, the second block B2 and the third block B3 may include low resolution patterns. In order to prevent mismatch in patterning, the photomask may further include first buffer blocks BB1 and second buffer blocks BB2. The first buffer blocks BB1 surround the second block B2 and the second buffer blocks BB2 surround the third block B3. Each first buffer block BB1 may have a width of 300 μm. In other words, the first buffer blocks BB1 on both sides of the second block B2 may have a total width of 600 μm. Similarly, each second buffer block BB2 may have a width of 300 μm, and the second buffer blocks BB2 on both sides of the third block B3 may have a total width of 600 μm. In some embodiments, in order to avoid light leakage at the edges of the predetermined pattern P due to misalignment, the first buffer blocks BB1 and the second buffer blocks BB2 may be subjected to exposure such that the predetermined pattern P is formed within the region bounded by the first buffer blocks BB1 and within the region bounded by the second buffer blocks BB2. With the addition of the first buffer block BB1 and the second buffer block BB2, the mismatch pattering due to variation between each machines may be sufficiently alleviated.

Figure 6:
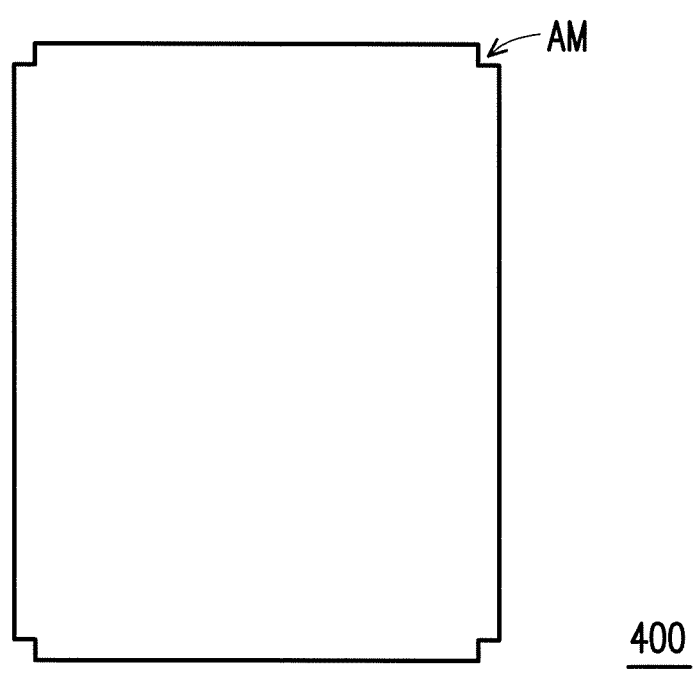
FIG. 6 is a schematic top view illustrating a first mask layer in FIG. 3A in accordance with some alternative embodiments.

It should be noted that in FIGS. 5A-5B, the first marks AM1 and the second marks AM2 are respectively formed in conjunction with the first exposure process and the second exposure process. However, the disclosure is not limited thereto. In some alternative embodiments, the marks AM may be formed prior to the first exposure process. FIG. 6 is a schematic top view illustrating a first mask layer 400 in FIG. 3A in accordance with some alternative embodiments. Referring to FIG. 6, before the first exposure process, the marks AM may be formed at corners of the first mask layer 400. During the steps as illustrated in FIGS. 3A-3G, the marks AM may be transferred onto corners of the patterned hard mask layer 300b and corners of the patterned phase shift layer 200b while serving the function of aiding alignment.

It should be noted that the content with respect to the first marks AM1, the second marks AM2, and the marks AM described above utilizes embodiments adapting negative tone photoresist as examples, but the disclosure is not limited thereto. The foregoing contents may also apply to embodiments adapting positive tone photoresist (for example, the embodiments of FIGS. 1A-1L and FIGS. 2A-2O).

Figure 4A:
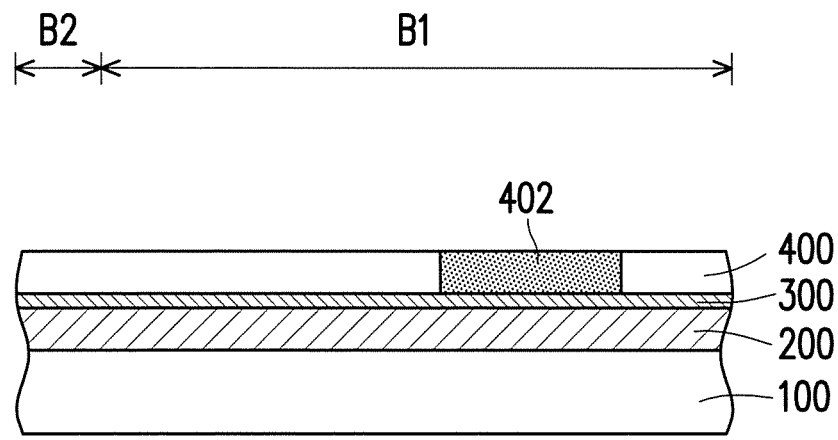
FIGS. 4A-4K are schematic cross-sectional views illustrating a process flow for manufacturing a photomask in accordance with some alternative embodiments of the disclosure.
Figure 4B:
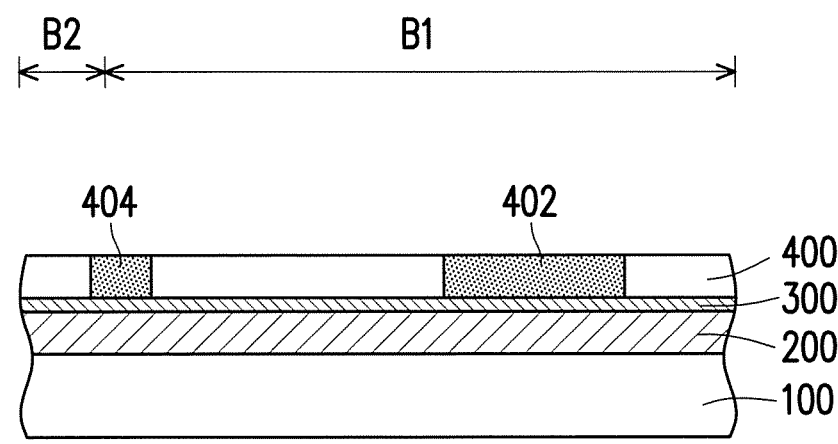
Figure 4C:
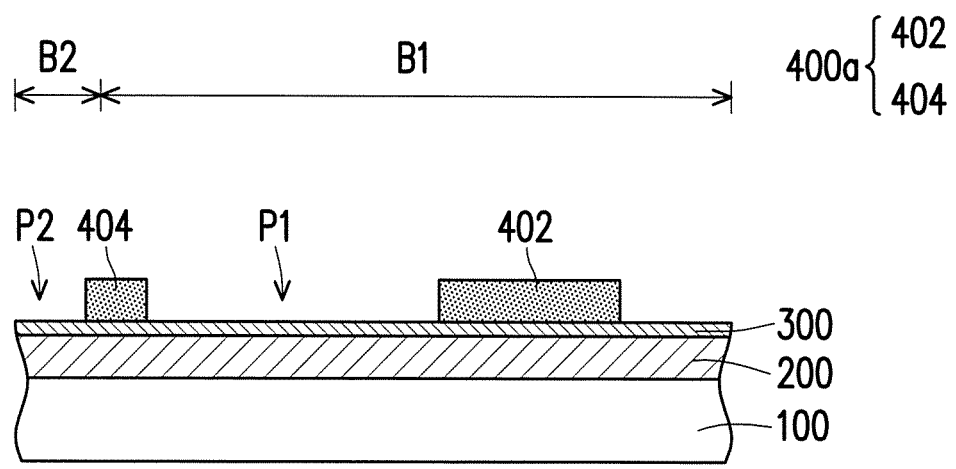
Figure 4D:
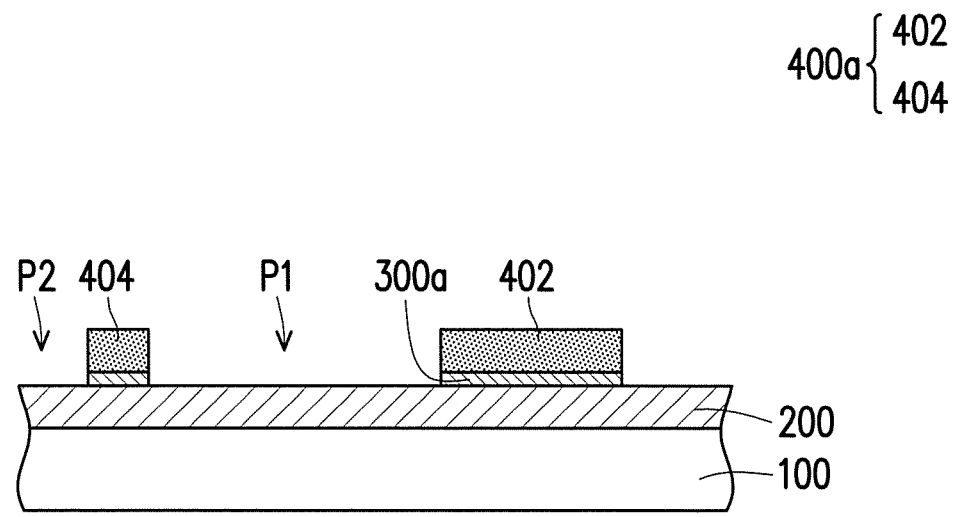
Figure 4E:
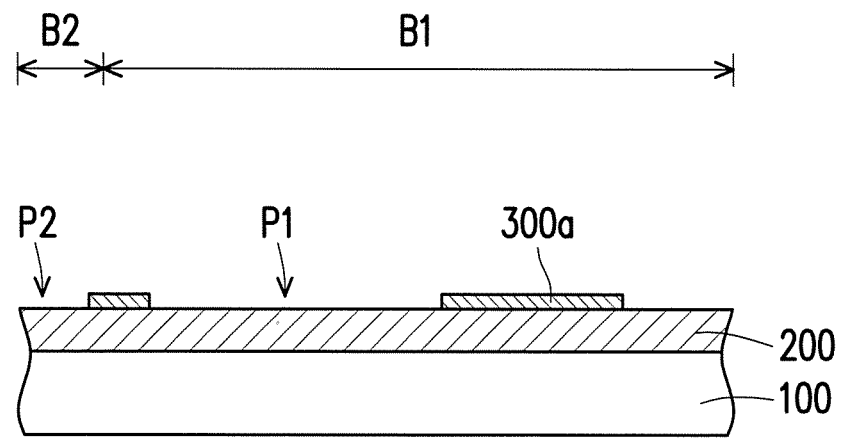
Figure 4F:
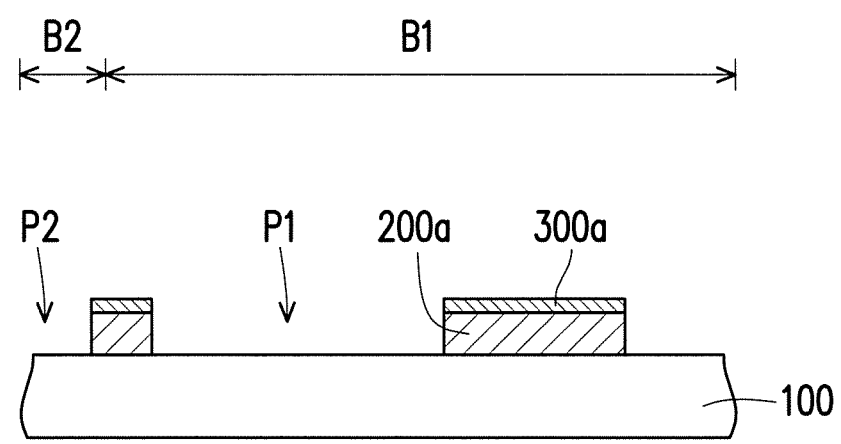

FIGS. 4A-4K are schematic cross-sectional views illustrating a process flow for manufacturing a photomask 10D in accordance with some alternative embodiments of the disclosure. Referring to FIGS. 4A-4F, the steps described herein is similar to the steps of FIGS. 3A-3F, so the detailed description thereof is omitted herein. In some embodiments, the first pattern P1 is located between the exposure regions 402, 404, as illustrated in FIG. 4C.

Figure 4G:
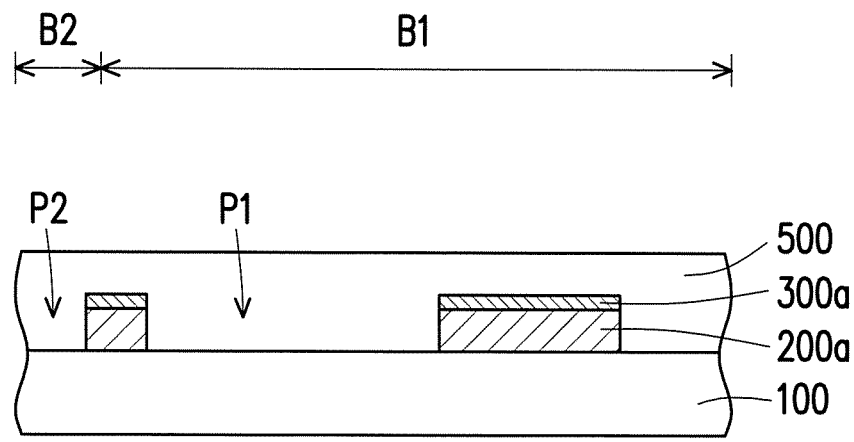

Referring to FIG. 4G, a second mask layer 500 is formed on the patterned hard mask layer 300a. A material and a formation method of the second mask layer 500 may be similar to the first mask layer 400, so the detailed description thereof is omitted herein.

Figure 4H:
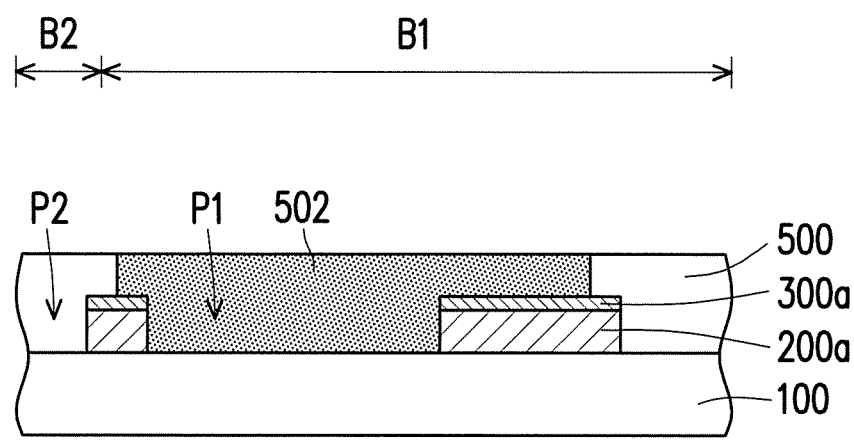

Referring to FIG. 4H, a third exposure process is performed on the second mask layer 500. The third exposure process may be similar to the first exposure process and the second exposure process, so the detailed description thereof is omitted herein. In some embodiments, the third exposure process is performed by irradiating a light beam onto at least a portion of the second mask layer 500 to form an exposure region 502. In some embodiments, the exposure region 502 is located in the first block B1. In other words, the third exposure process is performed on the first block B1. In some embodiments, the exposure region 502 is formed to be partially overlapped with the first pattern P1. In some embodiments, the first exposure process, the second exposure process, and the third exposure process may be executed by different machines. However, the disclosure is not limited thereto. In some alternative embodiments, the first exposure process and the third exposure process may be executed by the same machine while the second exposure process may be executed by a different machine.

Figure 4I:
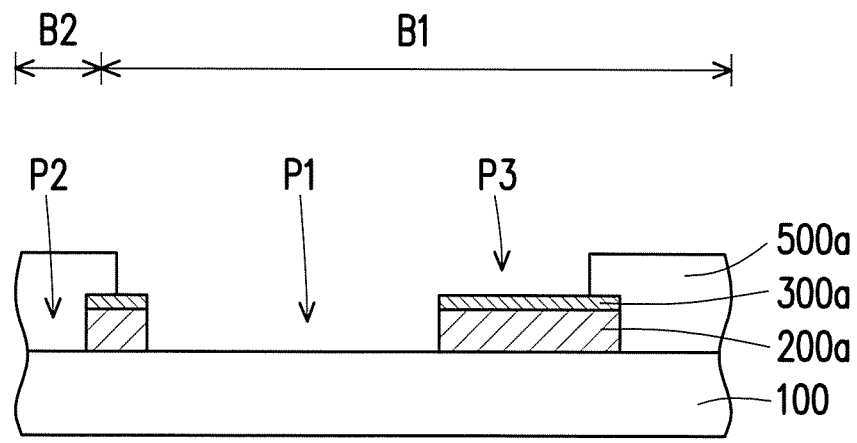

Referring to FIGS. 4H and 4I, a second development process is performed to remove at least a portion of the second mask layer 500. In some embodiments, the exposure region 502 is removed such that the third pattern P3 of the mask (not illustrated) is transferred onto the pattern second mask layer 500a. In some embodiments, the third pattern P3 of the patterned second mask layer 500a exposes at least a portion of the underlying patterned hard mask layer 300a. In some embodiments, the third pattern P3 of the patterned second mask layer 500a is partially overlap with the first pattern P1. In other words, the third pattern P3 also exposes the first pattern P1.

Figure 4J:
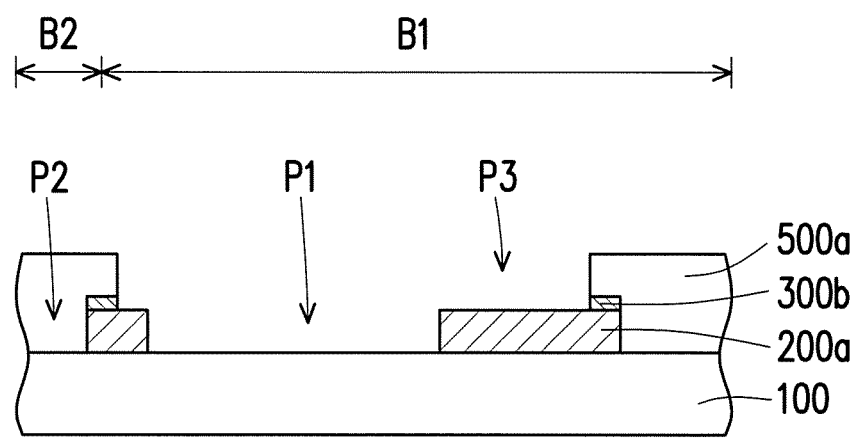

Referring to FIGS. 4I and 4J, a third etching process is performed to transfer the third pattern P3 onto the patterned hard mask layer 300b. For example, during the third etching process, the patterned second mask layer 500a may be adapted as a mask such that portions of the patterned hard mask layer 300a exposed by the third pattern P3 is removed to render the patterned hard mask layer 300b having the third pattern P3. In some embodiments, the third pattern P3 of the patterned hard mask layer 300b exposes at least a portion of the underlying patterned phase shift layer 200a. In addition, the third pattern P3 exposes the first pattern P1 and a portion of the light transmitting substrate 100.

Figure 4K:
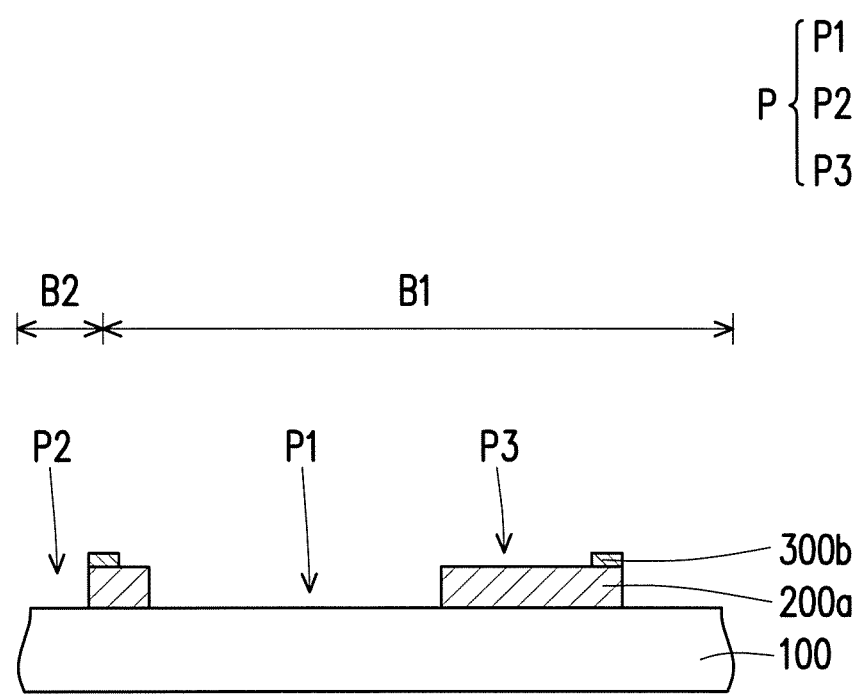

Referring to FIGS. 4J and 4K, the patterned second mask layer 500a is removed to obtain the photomask 10D. The patterned second mask layer 500a may be removed through, for example, a resist stripping process or a resist ashing process. As illustrated in FIG. 4K, regions of the light transmitting substrate 100 corresponding to the first pattern P1 and the second pattern P2 are exposed, and the patterned phase shift layer 200a corresponding to the third pattern P3 is exposed. The photomask 10D has a predetermined mask pattern P which is split into a first pattern P1, a second pattern P2, and a third pattern P3. The first pattern P1 and the third pattern P3 are located in the first block B1 and the second pattern P2 is located in the second block B2. In some embodiments, the photomask 10D may be referred to as an attenuated PSM.

It should be noted that the foregoing discussion mainly focuses on the manufacturing method of a photomask. However, the disclosure is not limited thereto. In some alternative embodiments, the methods presented in FIGS. 1A-1L, 2A-2O, 3A-3G, 4A-4K, 5A-5C, and 6 may also apply to a photolithography process for patterning a wafer (a wafer writing process). In addition, although the first pattern P1 and the second pattern P2 in FIGS. 1A-1L, 2A-2O, 3A-3G, 4A-4K are represented by openings, the disclosure is not limited thereto. In some alternative embodiments, the first pattern P1 and the second pattern P2 may also refer to traces, blocks, or lines formed on the photomask 10A, 10B, 10C, and 10D.

In accordance with some embodiments of the disclosure, a method of manufacturing a photomask includes at least the following steps. First, a phase shift layer and a hard mask layer are formed on a light transmitting substrate. A predetermined mask pattern is split into a first pattern and a second pattern. A series of processes is performed so that the hard mask layer and the phase shift layer have the first pattern and the second pattern. The series of processes includes at least the following steps. First, a first exposure process for transferring the first pattern is performed. Thereafter, a second exposure process for transferring the second pattern is performed. The first exposure process and the second exposure process are executed by different machines.

In accordance with some alternative embodiments of the disclosure, a method of manufacturing a photomask includes at least the following steps. First, a phase shift layer and a hard mask layer are formed on a light transmitting substrate. A predetermined mask pattern is split into a first pattern, a second pattern, and a third pattern. A first patterning process is performed so that the hard mask layer has the first pattern. A first etching process is performed using the hard mask layer as a mask, so that the phase shift layer has the first pattern. A second patterning process is performed so that the hard mask layer has the second pattern and the third pattern. A third patterning process is performed so that the phase shift layer further has the second pattern.

In accordance with some embodiments of the disclosure, a photomask includes a light transmitting substrate and a phase shift layer. The shift layer is disposed on the light transmitting substrate. The phase shift layer has at least one first mark.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a photomask, comprising:
   forming a phase shift layer and a hard mask layer on a light transmitting substrate;
   splitting a predetermined mask pattern into a first pattern, a second pattern, and a third pattern;

performing a first patterning process using a first photoresist layer so that the hard mask layer has the first pattern;
removing the first photoresist layer;
performing a first etching process using the hard mask layer as a mask, so that the phase shift layer has the first pattern;
performing a second patterning process using a second photoresist layer so that the hard mask layer has the second pattern and the third pattern;
removing the second photoresist layer;
performing a third patterning process using a third photoresist layer so that the phase shift layer further has only the second pattern, wherein the second pattern does not overlap with the first pattern, and the third pattern partially overlaps with the first pattern; and
removing the third photoresist layer.

2. The method of claim 1, wherein the hard mask layer is an opaque layer, regions of the light transmitting substrate corresponding to the first pattern and the second pattern are exposed, and the phase shift layer corresponding to the third pattern is exposed.

3. The method of claim 1, wherein the first patterning process comprises a first exposure process, the second patterning process comprises a second exposure process, the third patterning process comprises a third exposure process, and the first exposure process, the second exposure process, and the third exposure process are executed by different machines having different resolutions.

4. The method of claim 1, wherein the second pattern and the third pattern of the hard mask layer expose at least a portion of the phase shift layer.

5. A method of manufacturing a photomask, comprising:
sequentially forming a phase shift layer, a hard mask layer, and a first mask layer on a light transmitting substrate;
performing a first exposure process and a first development process to form a first pattern in the first mask layer;
transferring the first pattern into the hard mask layer and the phase shift layer to form a patterned hard mask layer and a patterned phase shift layer;
removing the first mask layer;
forming a second mask layer on the patterned hard mask layer;
performing a second exposure process and a second development process to form a second pattern and a third pattern in the second mask layer;
transferring the second pattern and the third pattern into the patterned hard mask layer;
removing the second mask layer;
forming a third mask layer on the patterned hard mask layer and the patterned phase shift layer;
performing a third exposure process and a third development process to form only the second pattern in the third mask layer;
transferring the second pattern in the third mask layer into the patterned phase shift layer, wherein the second pattern does not overlap with the first pattern, and the third pattern partially overlaps with the first pattern; and
removing the third mask layer.

6. The method of claim 5, wherein the patterned hard mask layer is an opaque layer, regions of the light transmitting substrate corresponding to the first pattern and the second pattern are exposed, and the patterned phase shift layer corresponding to the third pattern is exposed.

7. The method of claim 5, wherein the first mask layer, the second mask layer, and the third mask layer are positive tone photoresists.

8. The method of claim 5, wherein the step of transferring the second pattern and the third pattern into the patterned hard mask layer comprises:
performing an etching process to remove the patterned hard mask layer exposed by the second pattern and the third pattern using the second mask layer as a mask.

9. The method of claim 5, wherein the first exposure process, the second exposure process, and the third exposure process are executed by different machines having different resolutions.

10. The method of claim 5, wherein the second pattern and the third pattern of the patterned hard mask layer expose at least a portion of the patterned phase shift layer.

11. A method of manufacturing a photomask, comprising:
sequentially forming a phase shift layer, a hard mask layer, and a first photoresist layer having a first pattern on a light transmitting substrate;
transferring the first pattern in the first photoresist layer into the hard mask layer to form a patterned hard mask layer;
removing the first photoresist layer;
transferring the first pattern in the patterned hard mask layer into the phase shift layer to form a patterned phase shift layer;
forming a second photoresist layer having a second pattern and a third pattern on the patterned hard mask layer;
transferring the second pattern and the third pattern into the patterned hard mask layer;
removing the second photoresist layer;
forming a third photoresist layer having only the second pattern on the patterned hard mask layer and the patterned phase shift layer;
transferring the second pattern in the third photoresist layer into the patterned phase shift layer, wherein the second pattern does not overlap with the first pattern, and the third pattern partially overlaps with the first pattern; and
removing the third photoresist layer.

12. The method of claim 11, wherein the patterned hard mask layer is an opaque layer, regions of the light transmitting substrate corresponding to the first pattern and the second pattern are exposed, and the patterned phase shift layer corresponding to the third pattern is exposed.

13. The method of claim 11, wherein the first photoresist layer, the second photoresist layer, and the third photoresist layer are positive tone photoresists.

14. The method of claim 11, wherein the step of transferring the second pattern and the third pattern into the patterned hard mask layer comprises:
performing an first etching process to remove the patterned hard mask layer exposed by the second pattern and the third pattern using the second photoresist layer as a mask.

15. The method of claim 14, wherein the step of transferring the second pattern in the third photoresist layer into the patterned phase shift layer comprises:
performing an second etching process to remove the patterned phase shift layer exposed by the second pattern using the third photoresist layer as a mask.

16. The method of claim 15, wherein an etching recipe of the first etching process and an etching recipe of the second etching process are different.

17. The method of claim 11, wherein the third photoresist layer covers the third pattern of the patterned hard mask layer and the first pattern of the phase shift layer.

18. The method of claim 11, wherein the step of transferring the first pattern in the first photoresist layer into the hard mask layer to form the patterned hard mask layer comprises:
   performing an etching process to remove the hard mask layer exposed by the first pattern using the first photoresist layer as a mask.

19. The method of claim 11, wherein the step of transferring the first pattern in the patterned hard mask layer into the phase shift layer to form the patterned phase shift layer comprises:
   performing an etching process to remove the phase shift layer exposed by the first pattern using the patterned hard mask layer as a mask.

20. The method of claim 11, wherein the second pattern and the third pattern of the patterned hard mask layer expose at least a portion of the patterned phase shift layer.

* * * * *